(12) United States Patent
Yang et al.

(10) Patent No.: US 11,798,625 B2
(45) Date of Patent: Oct. 24, 2023

(54) PROGRAM DEPENDENT BIASING OF UNSELECTED SUB-BLOCKS

(71) Applicant: SanDisk Technologies LLC, Addison, TX (US)

(72) Inventors: Xiang Yang, Santa Clara, CA (US); Deepanshu Dutta, Fremont, CA (US); Gerrit Jan Hemink, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 230 days.

(21) Appl. No.: 17/469,016

(22) Filed: Sep. 8, 2021

(65) Prior Publication Data

US 2023/0076245 A1    Mar. 9, 2023

(51) Int. Cl.

| G11C 16/04 | (2006.01) |
| G11C 16/08 | (2006.01) |
| G11C 16/10 | (2006.01) |
| G11C 16/26 | (2006.01) |
| G11C 11/56 | (2006.01) |
| H10B 43/10 | (2023.01) |
| H10B 43/27 | (2023.01) |

(52) U.S. Cl.
CPC .......... *G11C 16/08* (2013.01); *G11C 16/0483* (2013.01); *G11C 16/10* (2013.01); *G11C 16/26* (2013.01); *G11C 11/5671* (2013.01); *H10B 43/10* (2023.02); *H10B 43/27* (2023.02)

(58) Field of Classification Search
CPC ........................ G11C 16/0483; G11C 16/3454
See application file for complete search history.

(56) References Cited

U.S. PATENT DOCUMENTS

| 9,286,987 B1 * | 3/2016 | Dong ................ G11C 16/3427 |
| 10,157,680 B2 | 12/2018 | Yang et al. |
| 10,726,920 B2 | 7/2020 | Yang |

\* cited by examiner

*Primary Examiner* — Jason Lappas
(74) *Attorney, Agent, or Firm* — Vierra Magen Marcus LLP

(57) ABSTRACT

An apparatus includes a control circuit configured to connect to first word lines of a first vertical sub-block and second word lines of a second vertical sub-block. The first vertical sub-block and the second vertical sub-block include memory cells connected in series in NAND strings, each NAND string including memory cells coupled to the first word lines in series with memory cells connected to the second word lines. The control circuit is configured to program or sense memory cells along a selected first word line of the first vertical sub-block while applying a first voltage to second word lines that are connected to programmed memory cells and applying a second voltage to second word lines that are connected to unprogrammed memory cells.

20 Claims, 24 Drawing Sheets

FIG. 6B

| | 811 | 815 | 817 | 819 | |
|---|---|---|---|---|---|
| Vbl | BL | | | | |
| Vsgd | SGD0 | SGD1 | SGD2 | SGD3 | |
| | DWLd | DWLd | DWLd | DWLd | |
| Vbypass | WL17 | WL17 | WL17 | WL17 | ⎫ Unprog'd |
| Vbypass | WL16 | WL16 | WL16 | WL16 | ⎬ |
| Vbypass | WL15 | WL15 | WL15 | WL15 | ⎭ ⎫ VSB2 |
| V_OD2 | WL14 | WL14 | WL14 | WL14 | ⎫ ⎬ (unselected) |
| V_OD2 | WL13 | WL13 | WL13 | WL13 | ⎬ Prog'd ⎭ |
| V_OD2 | WL12 | WL12 | WL12 | WL12 | ⎭ |
| | DWL2 | DWL2 | DWL2 | DWL2 | |
| V_OD1 | WL11 | WL11 | WL11 | WL11 | ⎫ |
| V_OD1 | WL10 | WL10 | WL10 | WL10 | ⎬ Unprog'd ⎫ VSB1 |
| V_OD1 | WL9 | WL9 | WL9 | WL9 | ⎬ (selected) |
| V_OD1 | WL8 | WL8 | WL8 | WL8 | ⎭ |
| | WL7 | WL7 | WL7 | WL7 | Selected |
| V_OD1 | WL6 | WL6 | WL6 | WL6 | Prog'd ⎭ |
| | DWL1 | DWL1 | DWL1 | DWL1 | |
| Vbypass | WL5 | WL5 | WL5 | WL5 | ⎫ Unprog'd |
| Vbypass | WL4 | WL4 | WL4 | WL4 | ⎭ |
| V_OD2 | WL3 | WL3 | WL3 | WL3 | ⎫ ⎫ VSB0 |
| V_OD2 | WL2 | WL2 | WL2 | WL2 | ⎬ (unselected) |
| V_OD2 | WL1 | WL1 | WL1 | WL1 | ⎬ Prog'd |
| V_OD2 | WL0 | WL0 | WL0 | WL0 | ⎭ ⎭ |
| | DWLs | DWLs | DWLs | DWLs | |
| Vsgs | SGS1 | SGS2 | SGS3 | SGS4 | |
| Vcsrc | SL | | | | |

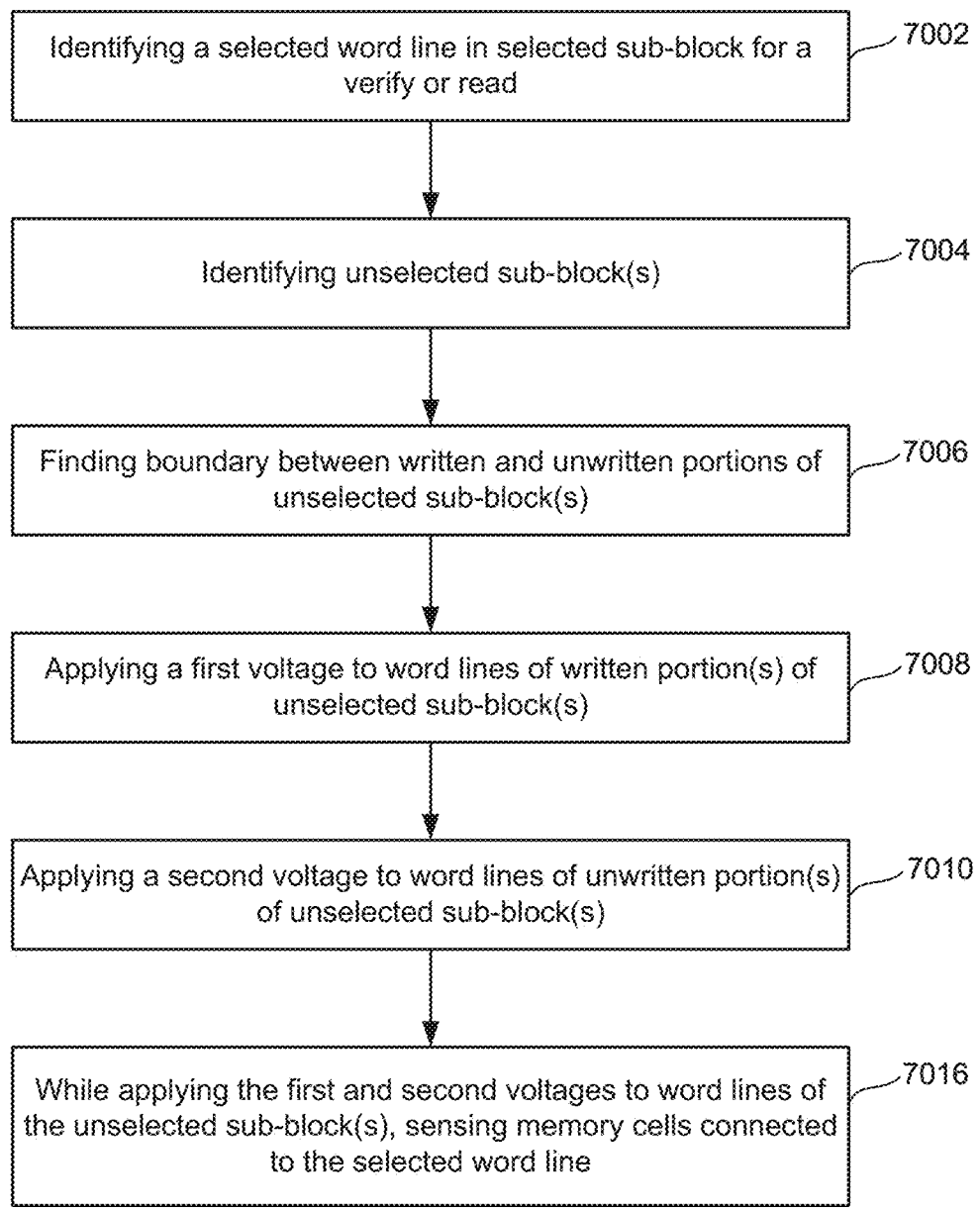

PROGRAM DEPENDENT BIASING OF UNSELECTED SUB-BLOCKS

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

One type of non-volatile memory has strings of non-volatile memory cells that have a select transistor at each end of the string. Typically, such strings are referred to as NAND strings. A NAND string may have a drain side select transistor at one end that connects the string to a bit line. A NAND string may have a source side select transistor at one end that connects the string to a source line. The non-volatile memory cells may also be referred to as non-volatile memory cell transistors, with the channels of the non-volatile memory cell transistors collectively being referred to as a NAND string channel.

BRIEF DESCRIPTION OF THE DRAWINGS

Like-numbered elements refer to common components in the different figures.

FIGS. 6A-B illustrate examples of connected sub-blocks and corresponding biasing schemes.

FIGS. 7A-D illustrate methods that include applying different voltages on different word lines of an unselected sub-block.

DETAILED DESCRIPTION

Figure 1:
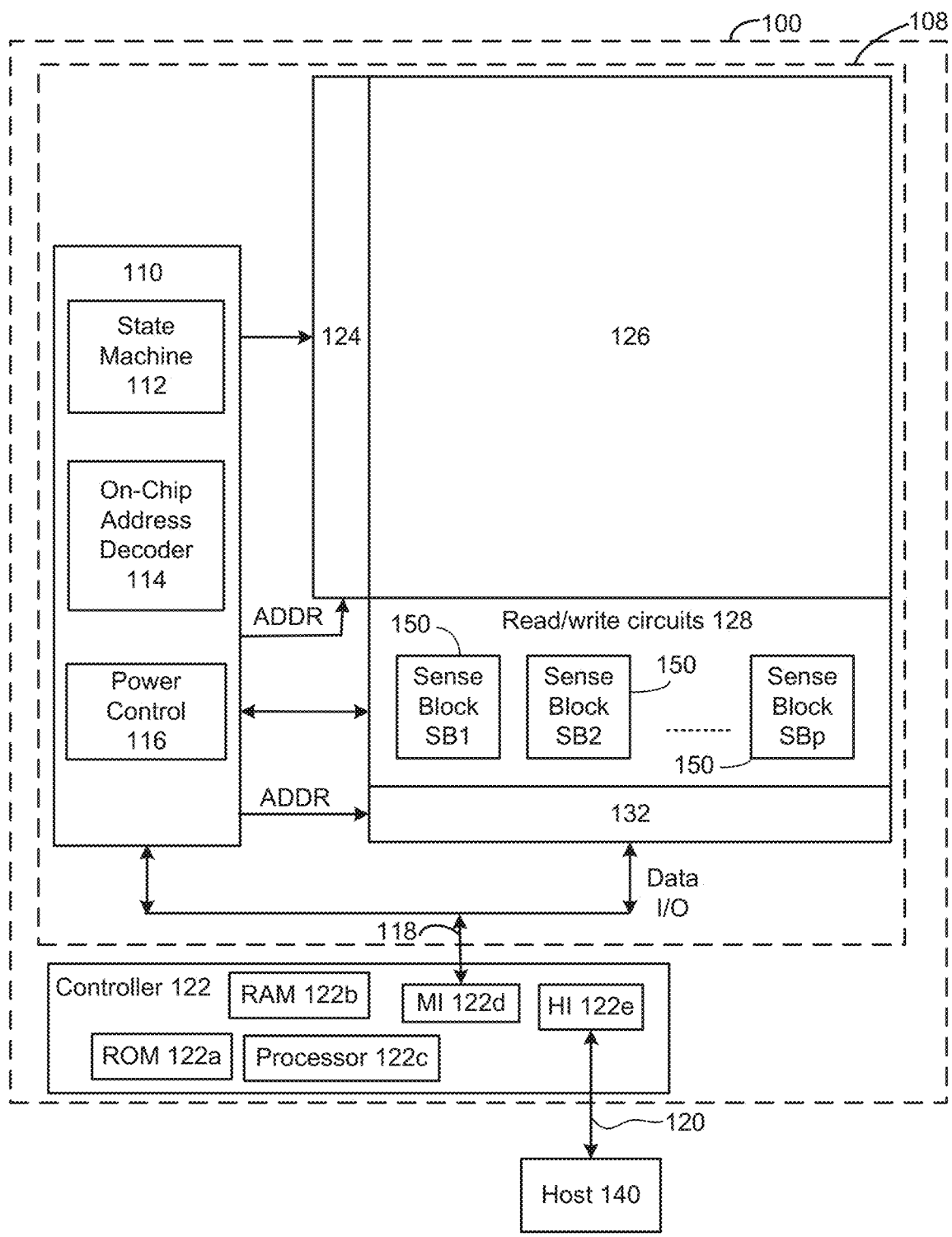
FIG. 1 is a functional block diagram of a memory device.

Techniques are provided for accessing a word line in a selected vertical sub-block that is connected to one or more unselected sub-block such that word lines of the unselected sub-block(s) receive different voltages depending on whether they are connected to programmed memory cells or unprogrammed memory cells. A voltage applied to word lines connected to unprogrammed (erased) memory cells of an unselected sub-block may be lower than a voltage applied to programmed memory cells of the unselected sub-block, which may be lower than a voltage applied to unselected memory cells of the selected sub-block. Prior to biasing word lines of an unselected sub-block, the boundary between programmed and unprogrammed portions of the sub-block may be found (e.g., from control information or by searching word lines of the unselected sub-block). Word lines on either side of this boundary are biased to different voltages (e.g., a lower voltage applied on word lines on the unprogrammed side, a higher voltage applied on word lines on the programmed side).

In some memory structures, NAND strings are in a block that is divided into vertical sub-blocks. The NAND strings run vertically through a stack of alternating horizontal conductive layers and horizontal dielectric layers, in one embodiment. The stack comprises tiers (also referred to as vertical sub-blocks), in one embodiment. Thus, each NAND string in the block resides in multiple vertical sub-blocks. In one embodiment, there are two such connected vertical sub-blocks. In one embodiment, there are at least three vertical sub-blocks.

The different vertical sub-blocks can be treated as separate units for erase/program purposes, in one embodiment. For example, data in different vertical sub-blocks may be logically unrelated so that connected sub-blocks (sub-blocks connected by shared NAND strings) may be programmed and erased at different times. The memory cells in one vertical sub-block can be independently erased while leaving valid data in the other connected vertical sub-blocks. Then, memory cells in the erased vertical sub-block can be programmed while valid data remains in the other vertical sub-blocks. Thus, different connected sub-blocks may have different numbers of write-erase cycles. Data in one vertical sub-block may remain throughout a period during which a connected vertical sub-block is repeatedly written and erased, which may expose the data to significant disturbance. Programming the memory cells in a selected vertical sub-block presents technical challenges due to the valid data in the other vertical sub-blocks. This may be particularly challenging in certain memory systems (e.g., may be more challenging in memory cells that store more than one bit of data per cell).

In one embodiment, while accessing a selected word line in a selected vertical sub-block, an overdrive voltage is applied to some memory cells and a bypass voltage is applied to other memory cells of one or more unselected vertical sub-block connected to the vertical selected sub-block. An overdrive voltage is defined herein as a voltage having a magnitude such that, when applied to a control gate of a memory cell, the memory cell will operate as a pass gate (e.g., conduct a current or "turn on") whether the memory cell is in a programmed state or an erased state. A bypass voltage is defined herein as a voltage having a magnitude such that, when applied to a control gate of a memory cell, the memory cell will operate as a pass gate (e.g., conduct current or "turn on") if the memory cell is in an erased state, but will not act as a pass gate for at least one programmed state. An overdrive voltage applied to memory cells in an unselected vertical sub-block may be different to (e.g., less than) an overdrive voltage applied to memory cells in a selected vertical sub-block. A bypass voltage applied to memory cells in an unselected vertical sub-block may be different to (e.g., less than) a bypass voltage applied to memory cells in a selected vertical sub-block.

FIG. 1-FIG. 4H describe examples of memory systems that can be used to implement the technology proposed herein. FIG. 1 is a functional block diagram of an example memory system 100. The components depicted in FIG. 1 are electrical circuits. Memory system 100 includes one or more memory dies 108. The one or more memory dies 108 can be complete memory dies or partial memory dies. In one embodiment, each memory die 108 includes a memory structure 126, control circuit 110, and read/write circuits 128. Memory structure 126 is addressable by word lines via a row decoder 124 and by bit lines via a column decoder 132. The read/write/erase circuits 128 include multiple sense blocks 150 including SB1, SB2, . . . , SBp (sensing circuitry) and allow a page of memory cells to be read or programmed in parallel. Also, many strings of memory cells can be erased in parallel.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuit 110 cooperates with the read/write circuits 128 to perform memory operations (e.g., write, read, erase and others) on memory structure 126, and includes state machine 112, an on-chip address decoder 114, and a power control circuit 116. In one embodiment, control circuit 110 includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control circuit 116 controls the power and voltages supplied to the word lines, bit lines, and select lines during memory operations. The power control circuit 116 includes voltage circuitry, in one embodiment. Power control circuit 116 may include charge pumps for creating voltages. The sense blocks include bit line drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs various functions described herein. The control circuit can include hardware only or a combination of hardware and software (including firmware). For example, a controller programmed by firmware to perform the functions described herein is one example of a control circuit. A control circuit can include a processor, PGA (Programmable Gate Array, FPGA (Field Programmable Gate Array), ASIC (Application Specific Integrated Circuit), integrated circuit or other type of circuit.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively, or additionally, one or more processors 122c can access code from a storage device in the memory structure, such as a reserved area of memory cells connected to one or more word lines. RAM 122b can be to store data for controller 122, including caching program data (discussed below). Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuit 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 126 comprises a two-dimensional memory array of non-volatile memory cells. In one example, the non-volatile memory cells are NAND flash memory cells utilizing floating gates. Other types of memory cells (e.g., NOR-type flash memory) can also be used. The exact type of memory array architecture or memory cell included in memory structure 126 is not limited to the examples above.

Figure 2A:
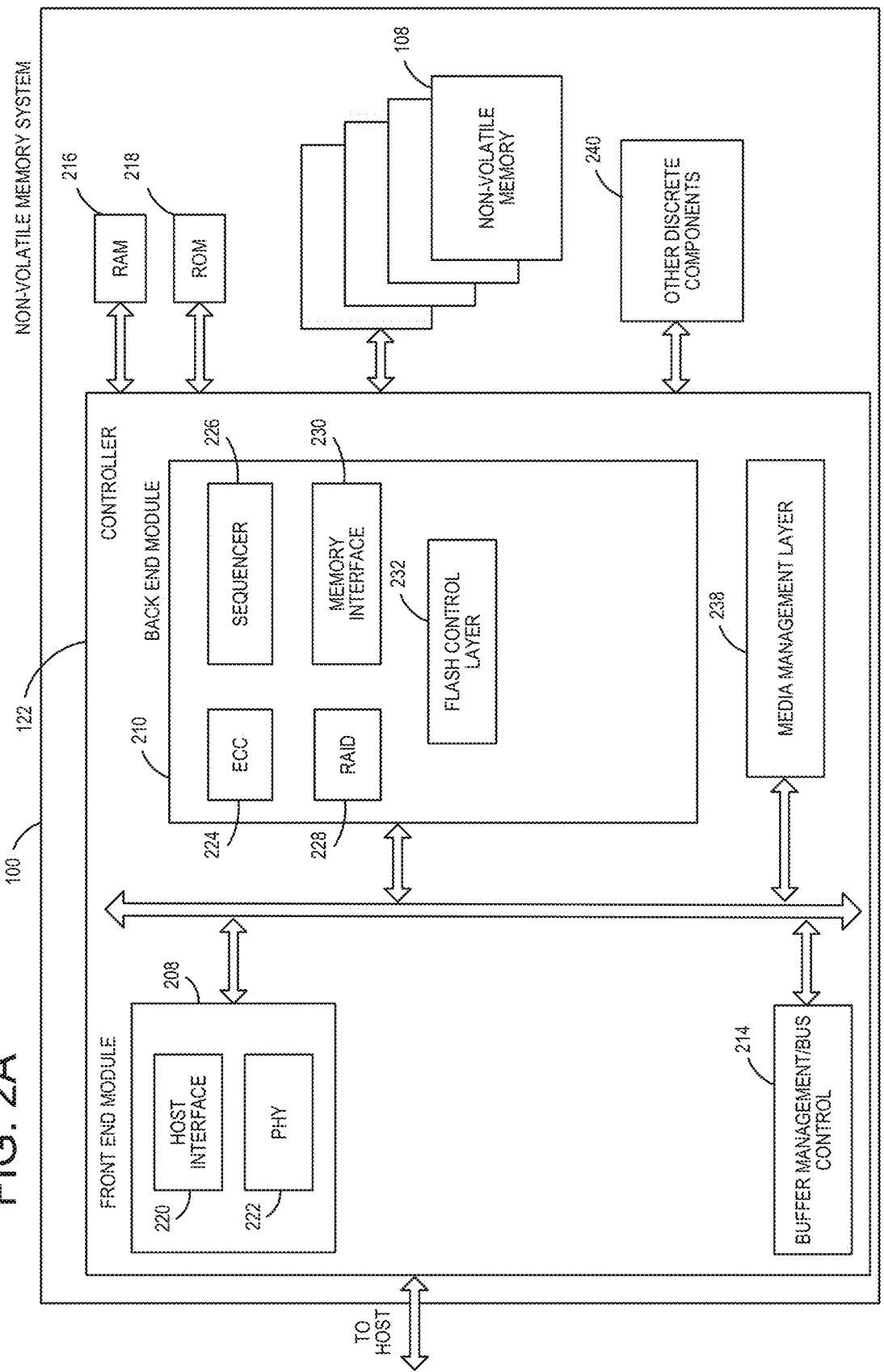
FIGS. 2A-B are block diagrams depicting embodiments of a memory system.

FIG. 2A is a block diagram of example memory system 100, depicting more details of one embodiment of controller 122. The controller in FIG. 2A is a flash memory controller but note that the non-volatile memory die 108 is not limited to flash. Thus, the controller 122 is not limited to the example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2A, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2A may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for controller 122 to perform the functions described herein. The architecture depicted in FIG. 2A is one example implementation that may (or may not) use the components of controller 122 depicted in FIG. 1 (i.e., RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2A as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g., as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 2A include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory 126 of memory die 108. The MML 238 may be needed because: 1) the memory may have limited endurance; 2) the memory 126 may only be written in multiples of pages; and/or 3) the memory 126 may not be written unless it is erased as a block (or a tier within a block in some embodiments). The MML 238 understands these potential limitations of the memory 126 which may not be visible to the host. Accordingly, the MML 238 attempts to translate the writes from host into writes into the memory 126.

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

In one embodiment, the control circuit(s) (e.g., control circuits 110) are formed on a first die, referred to as a control die, and the memory array (e.g., memory structure 126) is formed on a second die, referred to as a memory die. For example, some or all control circuits (e.g., control circuit 110, row decoder 124, column decoder 132, and read/write circuits 128) associated with a memory may be formed on the same control die. A control die may be bonded to one or more corresponding memory die to form an integrated memory assembly. The control die and the memory die may have bond pads arranged for electrical connection to each other. Bond pads of the control die and the memory die may be aligned and bonded together by any of a variety of bonding techniques, depending in part on bond pad size and bond pad spacing (i.e., bond pad pitch). In some embodiments, the bond pads are bonded directly to each other, without solder or other added material, in a so-called Cu-to-Cu bonding process. In some examples, dies are bonded in a one-to-one arrangement (e.g., one control die to one memory die). In some examples, there may be more than one control die and/or more than one memory die in an integrated memory assembly. In some embodiments, an integrated memory assembly includes a stack of multiple control die and/or multiple memory die. In some embodiments, the control die is connected to, or otherwise in communication with, a memory controller. For example, a memory controller may receive data to be programmed into a memory array. The memory controller will forward that data to the control die so that the control die can program that data into the memory array on the memory die.

Figure 2B:
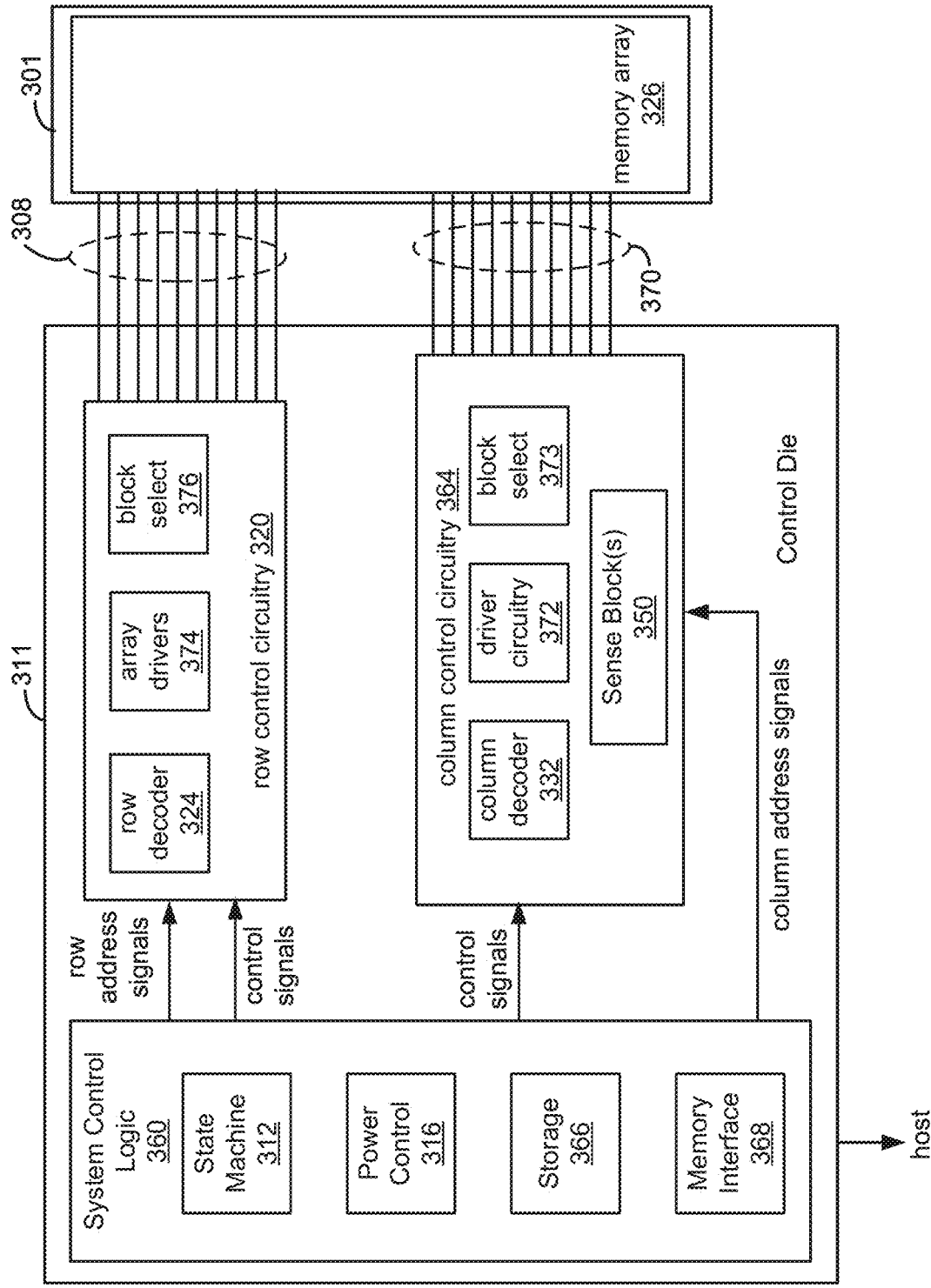

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 307. One or more integrated memory assemblies 307 may be used in a memory package in storage system 100. The integrated memory assembly 307 includes two types of semiconductor die (or more succinctly, "die"). Memory die 301 includes memory array 326 (memory structure 326, which may be any suitable memory as described with respect to memory structure 126). Memory array 326 may contain non-volatile memory cells.

Control die 311 includes column control circuitry 364, row control circuitry 320 and system control logic 360 (including state machine 312, power control module 316, storage 366, and memory interface 368). In some embodiments, control die 311 is configured to connect to the memory array 326 in the memory die 301. FIG. 2B shows an example of the peripheral circuitry, including control circuits, formed in a peripheral circuit or control die 311 coupled to memory array 326 formed in memory die 301. System control logic 360, row control circuitry 320, and column control circuitry 364 are located in control die 311. In some embodiments, all or a portion of the column control circuitry 364 and all or a portion of the row control circuitry 320 are located on the memory die 301. In some embodiments, some of the circuitry in the system control logic 360 is located on the on the memory die 301.

System control logic 360, row control circuitry 320, and column control circuitry 364 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 364). Thus, while moving such circuits from a die such as memory die 301 may reduce the number of steps needed to fabricate such a die, adding such circuits to a die such as control die 311 may not require many additional process steps.

FIG. 2B shows column control circuitry 364 including sense block(s) 350 on the control die 311 coupled to memory array 326 on the memory die 301 through electrical paths 370. For example, electrical paths 370 may provide electrical connection between column decoder 332, driver circuitry 372, and block select 373 and bit lines of memory array (or memory structure) 326. Electrical paths may extend from column control circuitry 364 in control die 311 through pads on control die 311 that are bonded to corresponding pads of the memory die 301, which are connected to bit lines of memory structure 326. Each bit line of memory structure 326 may have a corresponding electrical path in electrical paths 370, including a pair of bond pads, which connects to column control circuitry 364. Similarly, row control circuitry 320, including row decoder 324, array drivers 374, and block select 376 are coupled to memory array 326 through electrical paths 308. Each of electrical path 308 may correspond to a word line, dummy word line, or select gate line. Additional electrical paths may also be provided between control die 311 and memory die 301.

In some embodiments, there is more than one control die 311 and/or more than one memory die 301 in an integrated memory assembly 307. In some embodiments, the integrated memory assembly 307 includes a stack of multiple control die 311 and multiple memory dies 301. In some embodiments, each control die 311 is affixed (e.g., bonded) to at least one of the memory dies 301.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
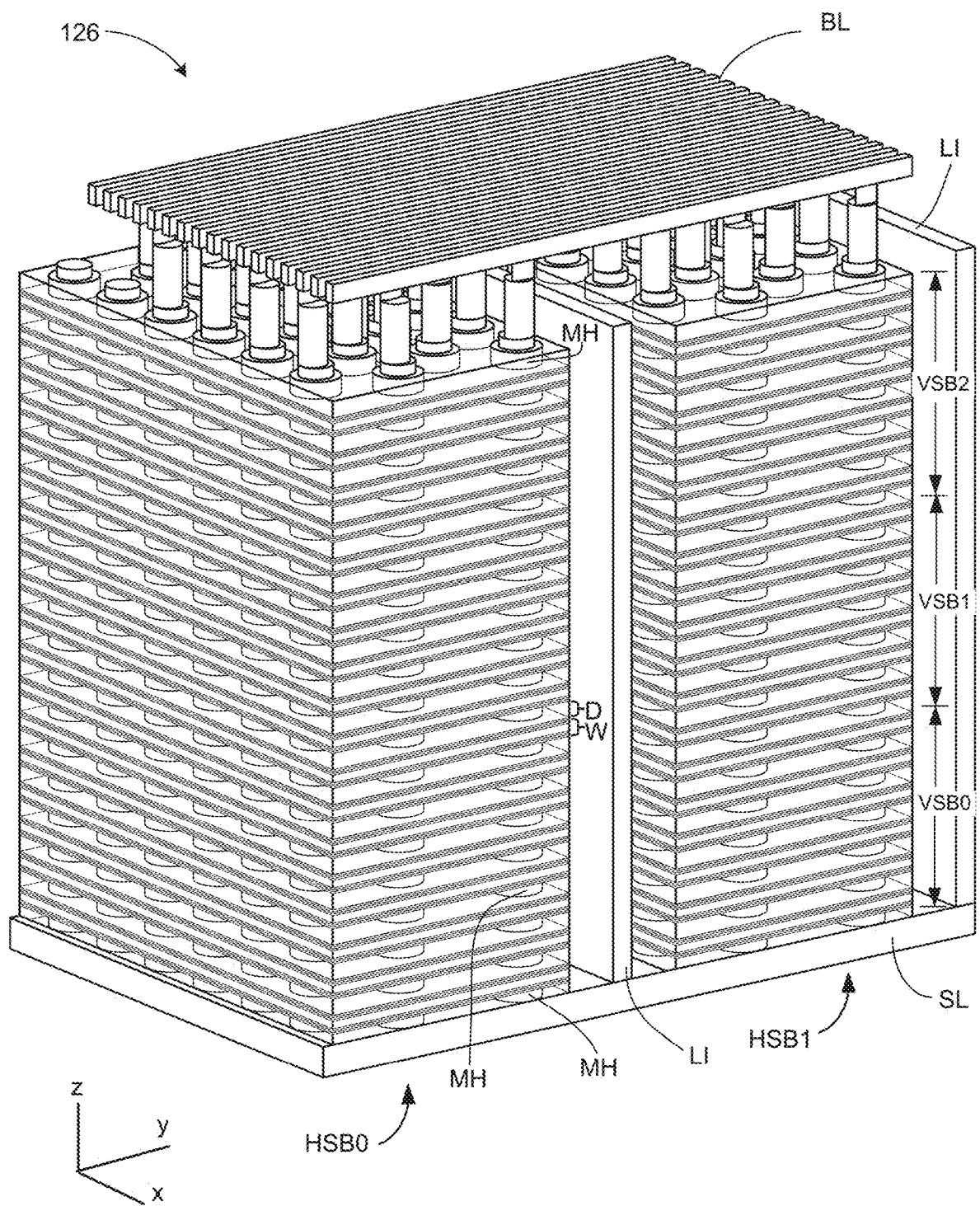
FIG. 3 is a perspective view of a portion of one embodiment of a monolithic three dimensional memory structure.

FIG. 3 is a perspective view of a portion of one example embodiment of a monolithic three dimensional memory array that can comprise memory structure 126 or 326, which includes a plurality non-volatile memory cells. For example, FIG. 3 shows a portion of one block of memory. The structure depicted includes a set of bit lines BL positioned above a stack of alternating dielectric layers and conductive layers. For example, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. Data word line layers have data memory cells. Dummy word line layers have dummy memory cells. As will be explained below, the alternating dielectric layers and conductive layers are divided into four "fingers" by local interconnects LI. FIG. 3 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 126 or 326 are provided below with respect to FIG. 4A-4H.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For purpose of discussion, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. There could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2.

Figure 4A:
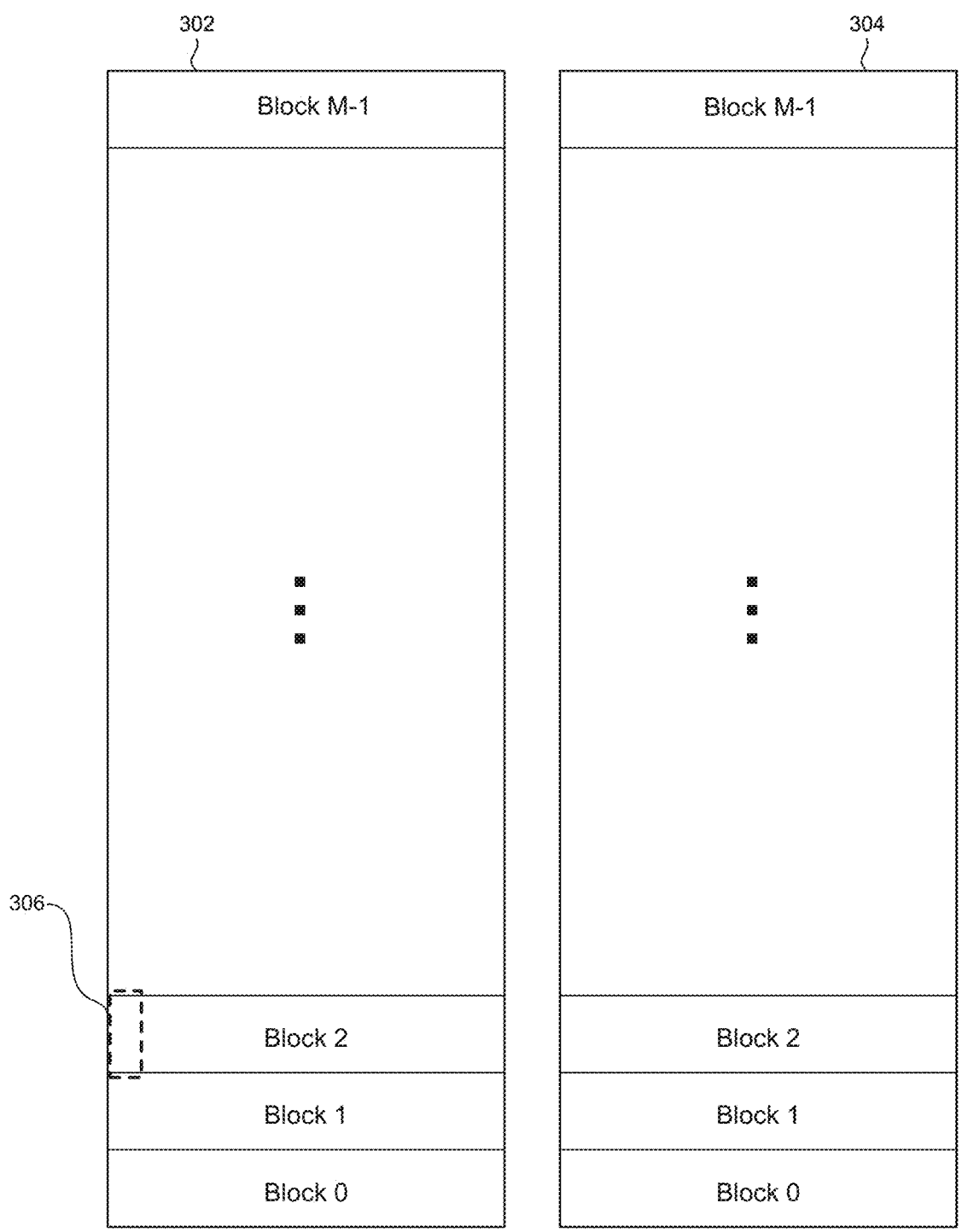
FIG. 4A is a block diagram of a memory structure having two planes.

FIG. 4A is a block diagram explaining one example organization of memory structure 126 or 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of word lines.

Figure 4B:
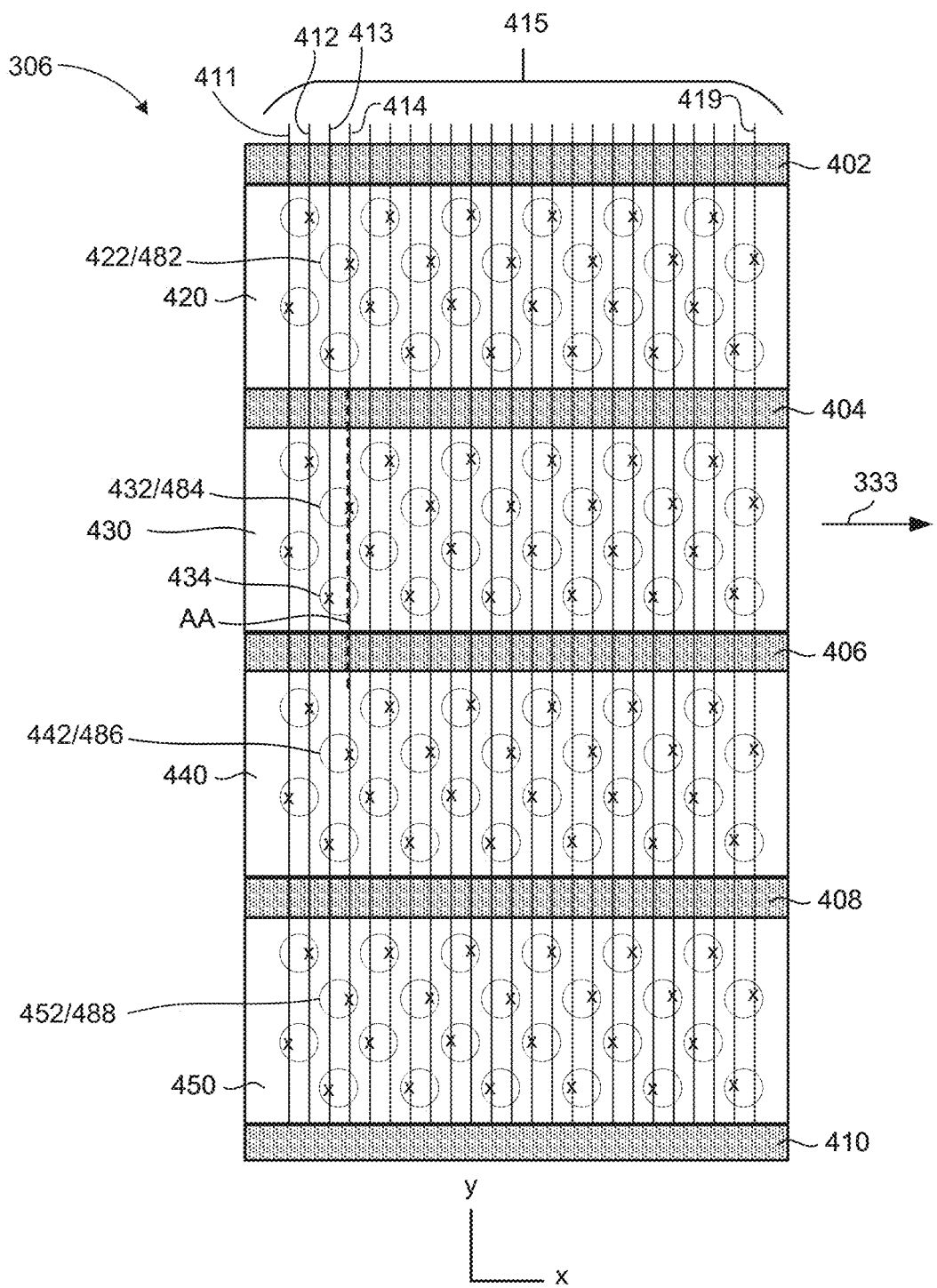
FIG. 4B depicts a top view of a portion of a block of memory cells.

FIGS. 4B-4F depict an example three dimensional ("3D") NAND structure that corresponds to the structure of FIG. 3 and can be used to implement memory structure 126 of FIG. 2A or 326 of FIG. 2B. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 333, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
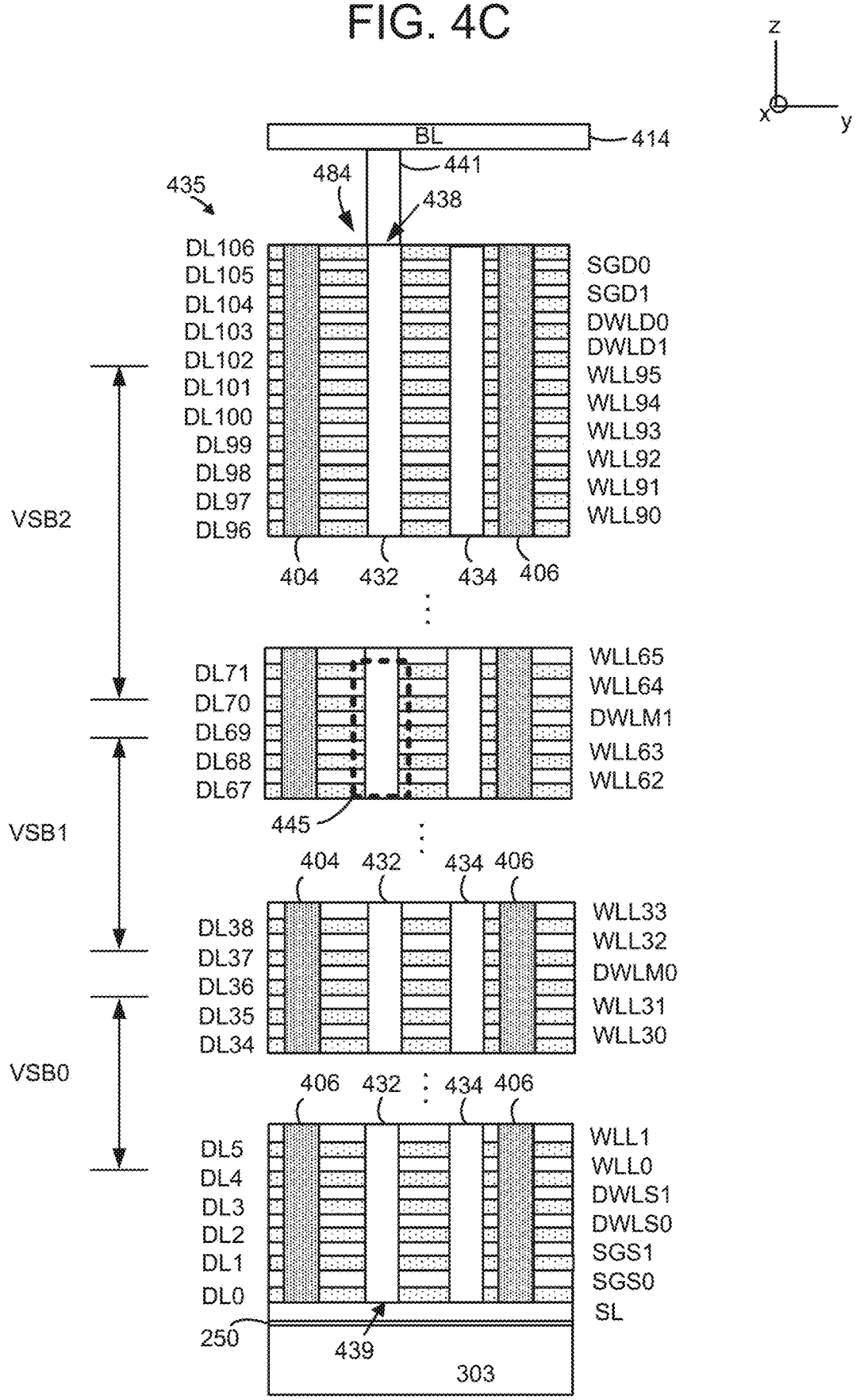
FIG. 4C depicts an embodiment of a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy word line layers DWLD0, DWLD1, DWLM1, DWLM0, DWLS0 and DWLS1 are provided, in addition to the data word line layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 303, an insulating film 250 on the substrate, and a portion of a source line SL. A portion of the bit line 414 is also depicted. Note that NAND string 484 is connected to the bit line 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bit line 414. The local interconnects 404 and 406 from FIG. 4B are also depicted.

The stack 435 is divided into three vertical sub-blocks (VSB0, VSB1, VSB2). Vertical sub-block VSB0 includes WLL0-WLL31. The following layers could also be considered to be a part of vertical sub-block VSB0 (SGS0, SGS1, DWLS0, DWLS1). Vertical sub-block VSB1 includes WLL32-WLL63. Vertical sub-block VSB2 includes WLL64-WLL95. The following layers could also be considered to be a part of vertical sub-block VSB2 (SGD0, SGD1, DWLD0, DWLD1). Each NAND string has a set of data memory cells in each of the vertical sub-blocks. Dummy word line layer DMLM0 is between vertical sub-block VSB0 and vertical sub-block VSB1. Dummy word line layer DMLM1 is between vertical sub-block VSB1 and vertical sub-block VSB2. The dummy word line layers have dummy memory cell transistors that may be used to electrically isolate a first set of memory cell transistors within the memory string (e.g., corresponding with vertical sub-block VSB0 word lines WLL0-WLL31) from a second set of memory cell transistors within the memory string (e.g., corresponding with the vertical sub-block VSB1 word lines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, wherein the transistor is either configured to not store user or system data or operated in such a way that the transistor is not used to store user data or system data. A word line that is connected to non-data transistors is referred to herein as a non-data word line. Examples of non-data word lines include, but are not limited to, dummy word lines, and a select line in a middle junction transistor layer.

The stack 435 may have more than three vertical sub-blocks. For example, the stack 435 may be divided into four, five or more vertical sub-blocks. Each of the vertical sub-block contains at least one data memory cell. There may additional layers similar to the middle dummy word line layers DWLM in order to divide the stack 435 into the additional vertical sub-blocks. In one embodiment, the stack has two vertical sub-blocks.

Figure 4D:
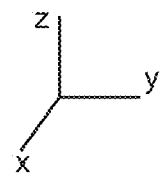
FIG. 4D depicts an alternative view of the select gate layers and word line layers of the stack 435 of FIG. 4C.
Figure 4D:
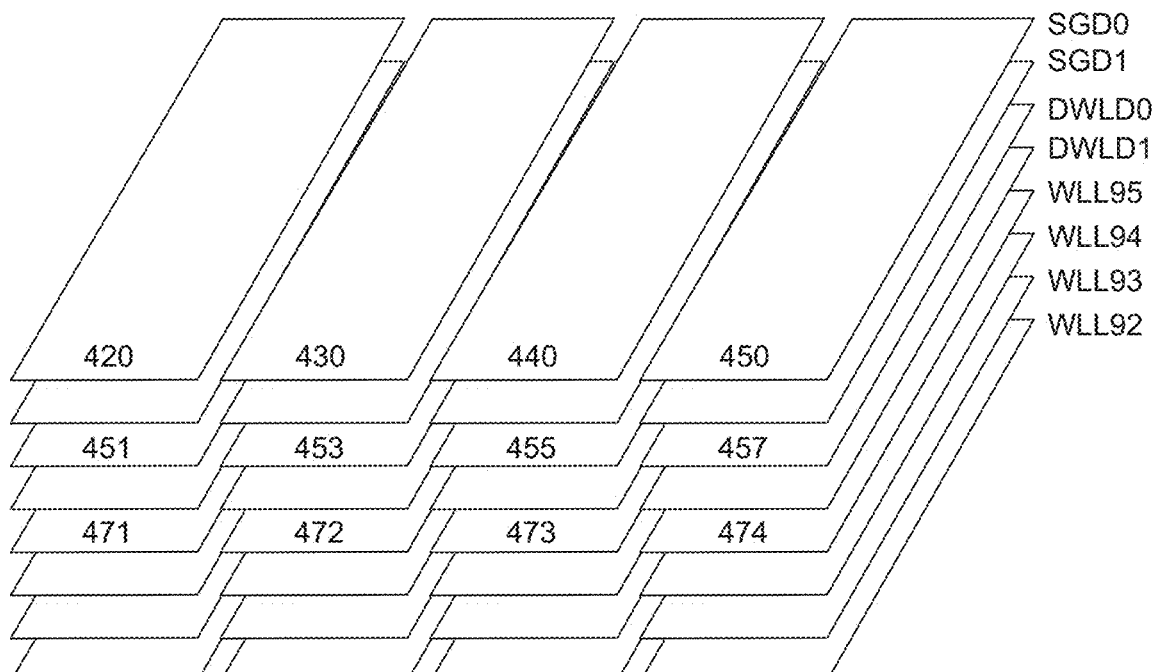
Figure 4D:
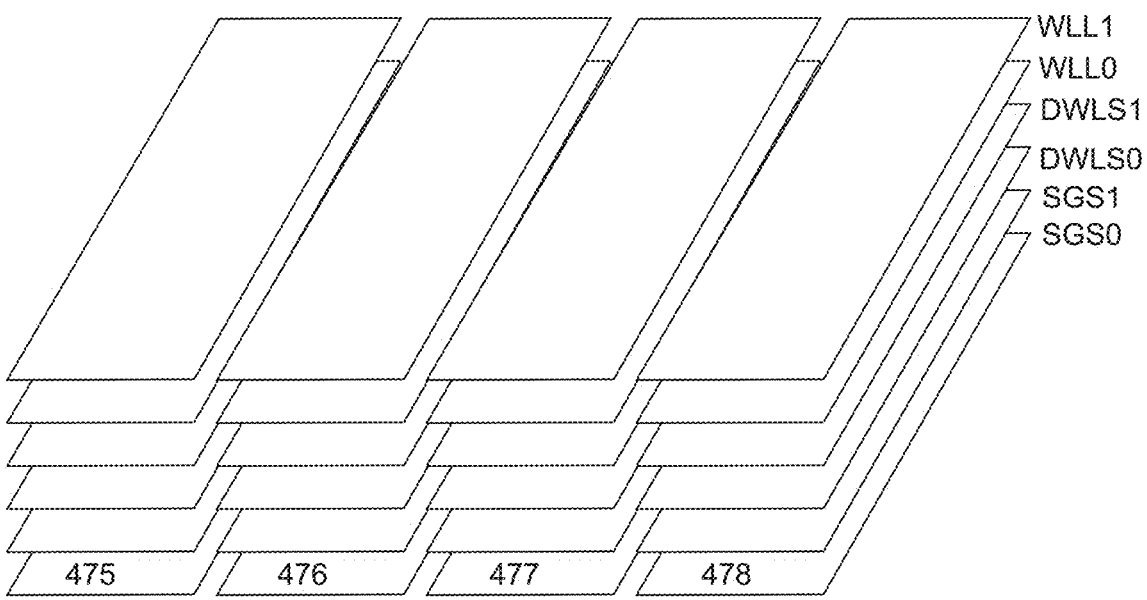

FIG. 4D depicts an alternative view of the SG layers and word line layers of the stack 435 of FIG. 4C. The SGD layers SGD0 and SGD0 (the drain-side SG layers) each includes parallel rows of SG lines associated with the drain-side of a set of NAND strings. For example, SGD0 includes drain-side SG regions 420, 430, 440 and 450, consistent with FIG. 4B.

Below the SGD layers are the drain-side dummy word line layers. Each dummy word line layer represents a word line, in one approach, and is connected to a set of dummy memory cells at a given height in the stack. For example, DWLD0 comprises word line layer regions 451, 453, 455 and 457. A dummy memory cell, also referred to as a non-data memory cell, does not store data and is ineligible to store data, while a data memory cell is eligible to store data. Moreover, the Vth of a dummy memory cell is generally fixed at the time of manufacture or may be periodically adjusted, while the Vth of the data memory cells changes more frequently, e.g., during erase and programming operations of the data memory cells.

Below the dummy word line layers are the data word line layers. For example, WLL95 comprises word line layer regions 471, 472, 473 and 474.

Below the data word line layers are the source-side dummy word line layers.

Below the source-side dummy word line layers are the SGS layers. The SGS layers SGS0 and SGS1 (the source-side SG layers) each includes parallel rows of SG lines associated with the source-side of a set of NAND strings. For example, SGS0 includes source-side SG lines 475, 476, 477 and 478. Each SG line can be independently controlled, in one approach. Or the SG lines can be connected and commonly controlled.

Figure 4E:
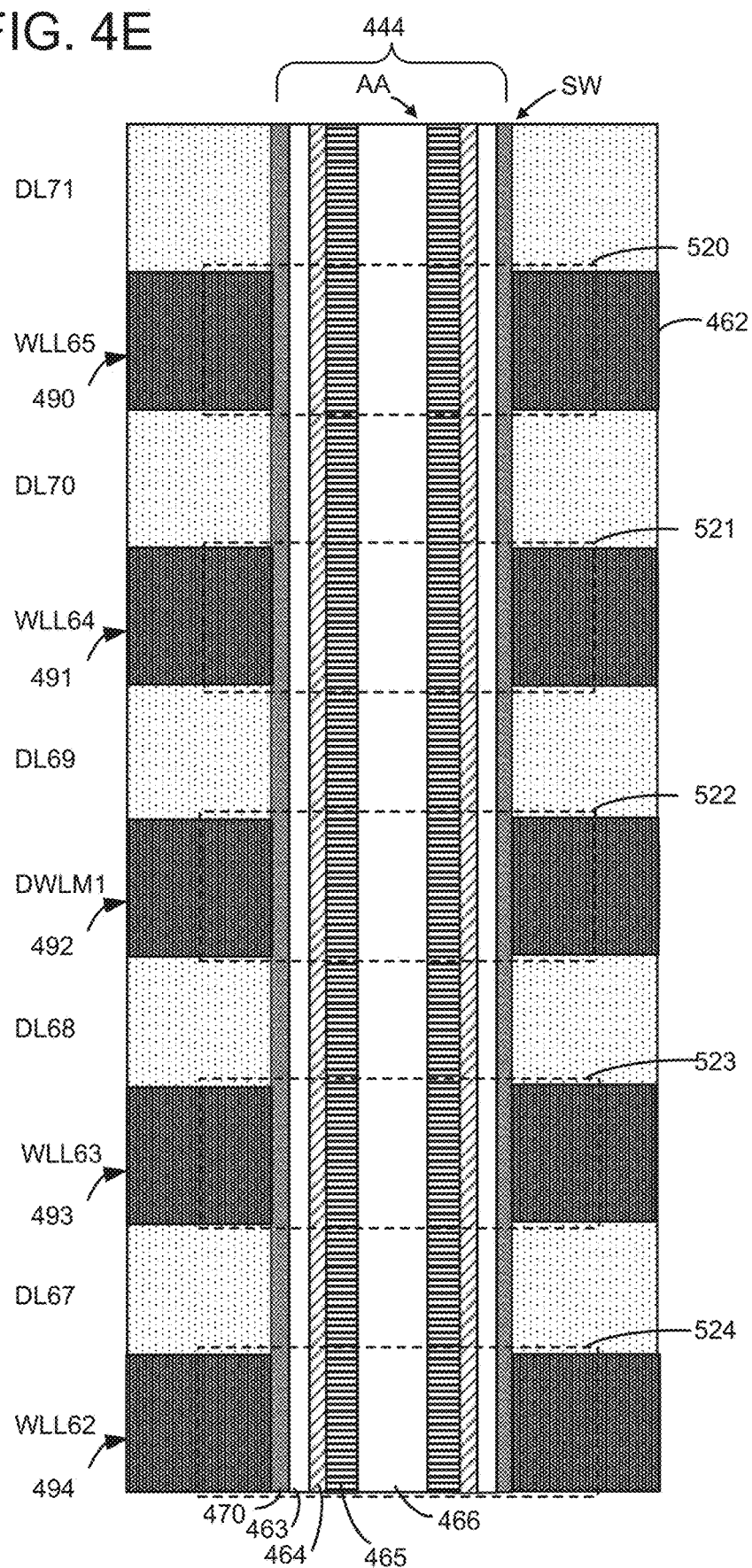
FIG. 4E depicts a view of the region 445 of FIG. 4C.

FIG. 4E depicts a view of the region 445 of FIG. 4C. Data memory cell transistors 520 and 521 are above dummy memory cell transistor 522. Below dummy memory cell transistor 522 are data memory cell transistors 523 and 524. A number of layers can be deposited along the sidewall (SW) of the memory hole 444 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. In FIG. 4E, dummy memory cell transistor 522 includes the charge trapping layer 463. Thus, the threshold voltage of at least some non-data transistors may also be adjusted by storing or removing electrons from the charge trapping layer 463. It is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the WLLs in each of the memory holes.

In some cases, the tunneling layer 464 can comprise multiple layers such as in an oxide-nitride-oxide configuration.

Figure 4F:
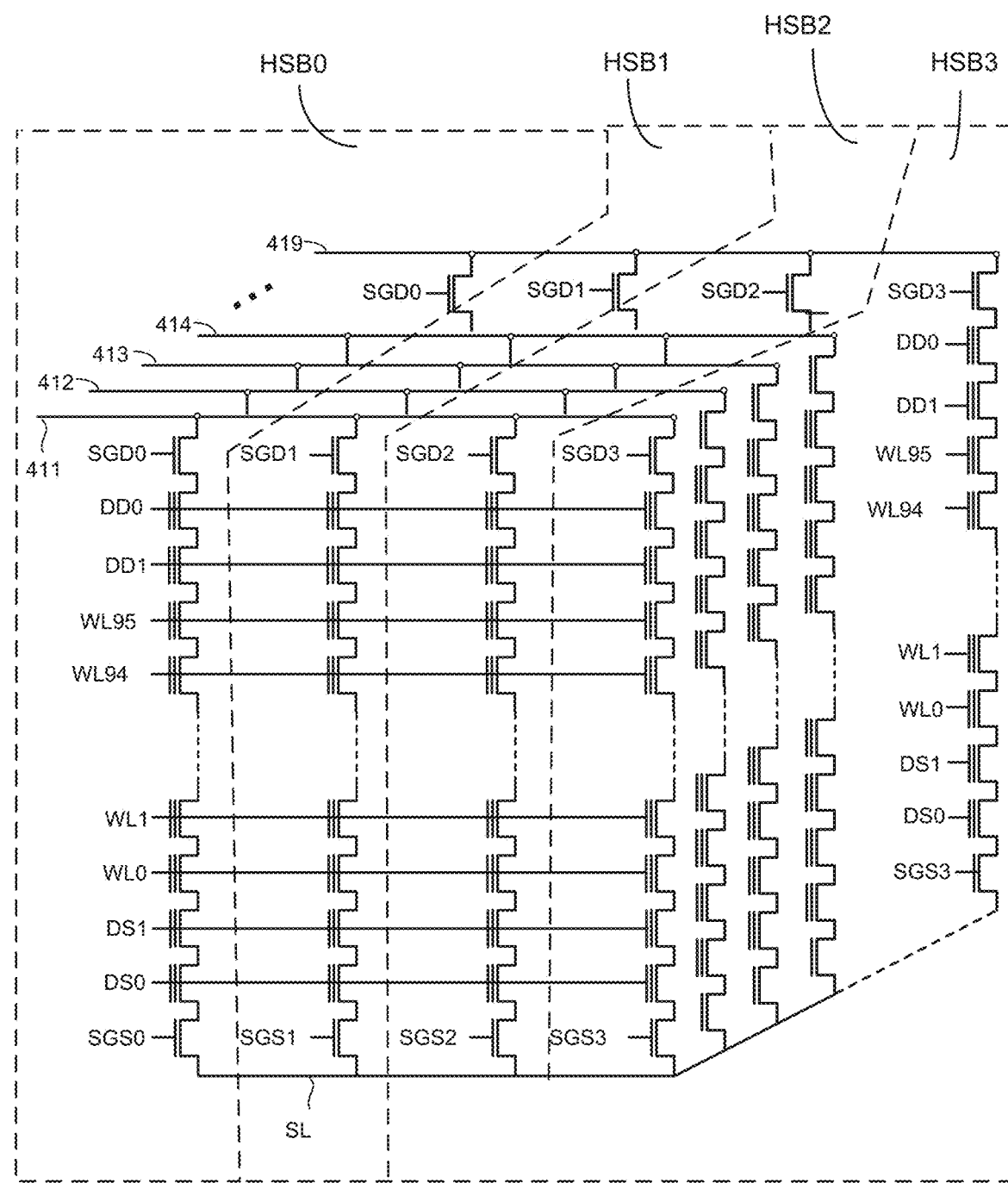
FIG. 4F is a schematic of a plurality of NAND strings showing multiple horizontal sub-blocks.

FIG. 4F is a schematic diagram of a portion of the memory depicted in in FIGS. 3-4E. FIG. 4F shows physical word lines WLL0-WLL95 running across the entire block. The structure of FIG. 4F corresponds to portion 306 in Block 2 of FIGS. 4A-E, including bit lines 411, 412, 413, 414, . . . . 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, Horizontal sub-block HSB1 corresponds to those vertical NAND strings controlled by SGD1 and SGS1, Horizontal sub-block HSB2 corresponds to those vertical NAND strings controlled by SGD2 and SGS2, and Horizontal sub-block HSB3 corresponds to those vertical NAND strings controlled by SGD3 and SGS3.

Figure 4G:
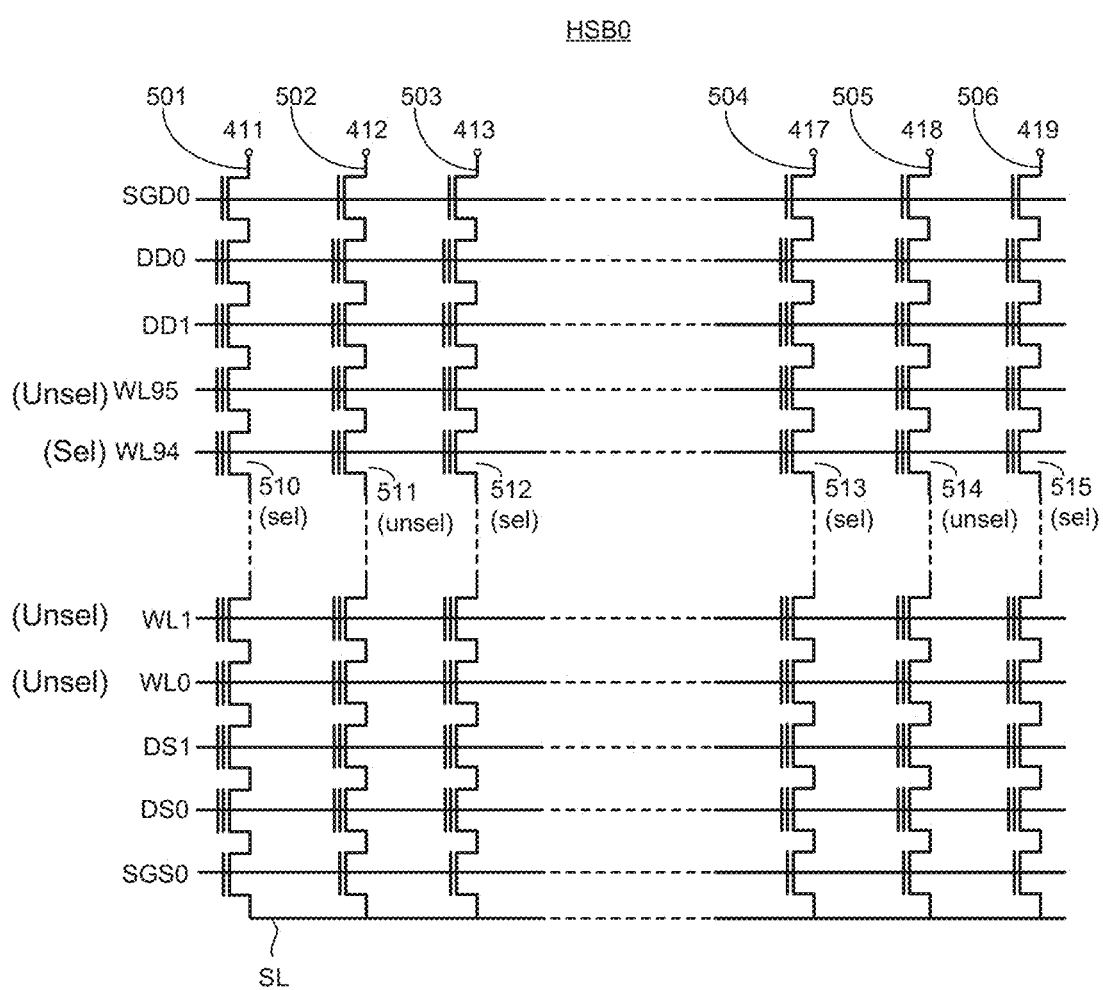
FIG. 4G is a schematic of a plurality of NAND strings showing one horizontal sub-block.

FIG. 4G is a schematic of horizontal sub-block HSB0. Horizontal sub-blocks HSB1, HSB2 and HSB3 have similar structures. FIG. 4G shows physical word lines WL0-WL95 running across the entire sub-block S0. All of the NAND strings of sub-block S0 are connected to SGD0 and SGS0. FIG. 4G only depicts six NAND stings 501, 502, 503, 504, 505 and 506; however, horizontal sub-block HSB0 will have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells while the memory cells that are not intended to take on a new electrical characteristic (or other characteristic) to reflect a changed programming state are referred to as the unselected memory cells. In certain situations, unselected memory cells may be connected to the same word line as selected memory cells. Unselected memory cells may also be connected to different word lines than selected memory cells. Similarly, during a reading process, the set of memory cells to be read are referred to as the selected memory cells while the memory cells that are not intended to be read are referred to as the unselected memory cells.

To better understand the concept of selected memory cells and unselected memory cells, assume a programming operation is to be performed and, for example purposes only, that word line WL94 and horizontal sub-block HSB0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HS0 are selected memory cells and some of the memory cells connected to WL94 in horizontal sub-block HS0 are unselected memory cells depending on how the programming operation is performed and the data pattern being programmed. For example, those memory cells that are to remain in the erased state S0 will be unselected memory cells, because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to word line WL94) are to remain in the erased state; therefore, memory cells 511 and 514 are unselected memory cells (labeled unsel in FIG. 4G). Additionally, assume for example purposes that memory cells 510, 512, 513 and 515 (which are connected to word line WL94) are to be programmed to any of the data states S1-S7; therefore, memory cells 510, 512, 513 and 515 are selected memory cells (labeled sel in FIG. 4G). While some memory cells along WL94 may be considered unselected memory cells because they are to remain in the erased state, WL94 may be considered as a "selected word line" in this scenario because selected memory cells 510, 512, 513 and 515 are connected to WL94 and are accessed via WL94.

4H is a schematic diagram of a NAND string. The NAND string 600 is similar to the NAND string 484 in FIG. 4C but has middle junction transistors to separate vertical sub-blocks. The NAND string 600 comprises a first portion of the NAND string (e.g., corresponding with vertical sub-block VSB0), a second portion of the NAND string (e.g., corresponding with vertical sub-block VSB1), a third portion of the NAND string (corresponding with vertical sub-block VSB2), middle junction transistor (MJT1) 614 arranged between the first portion of the NAND string and the second portion of the NAND string, and middle junction transistor (MJT2) 620 arranged between the second portion of the NAND string and the third portion of the NAND string.

Figure 4H:
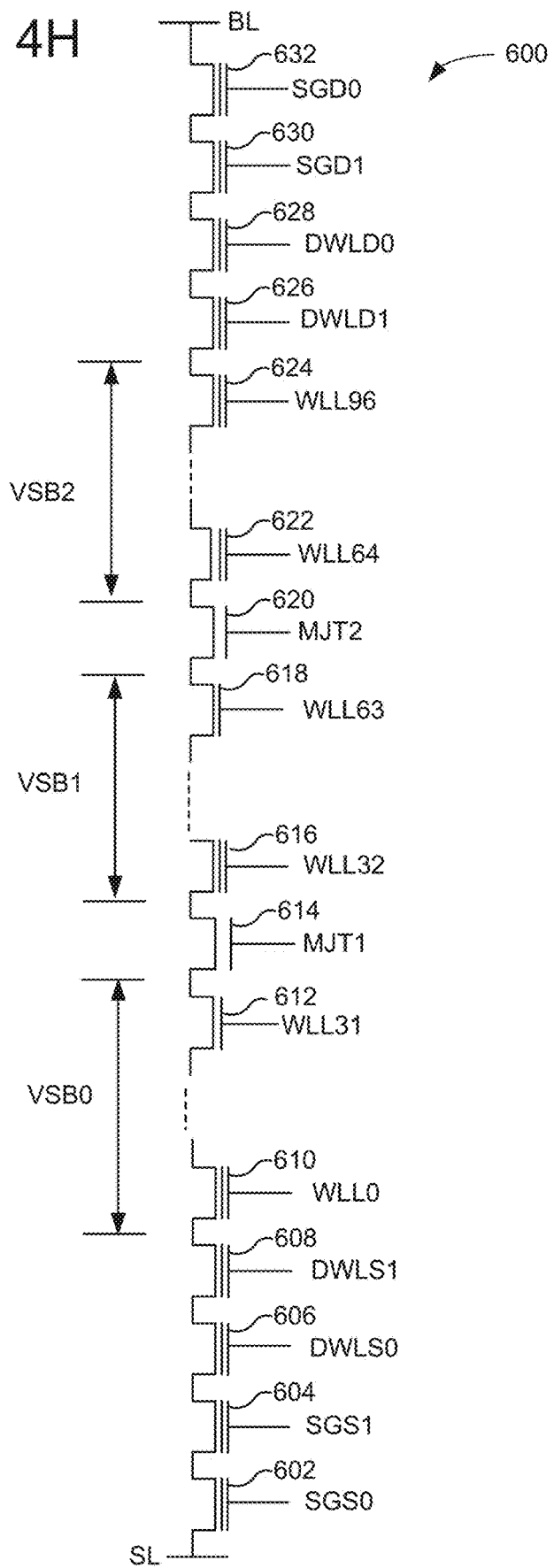
FIG. 4H is a schematic diagram of a NAND string extending through multiple vertical sub-blocks.

The first portion of the NAND string has memory cells 610-612 connected to word lines WLL0-WLL31. The second portion of the NAND string has memory cells 616-618 connected to word lines WLL32-WLL63. The third portion of the NAND string has memory cells 622-624 connected to word lines WLL64-WLL96. Not all memory cells of NAND string 600 are depicted in FIG. 4H. Also included on the NAND string 600 is a first source-side select gate transistor 602 connected to SGS0, a second source-side select gate transistor 604 connected to SGS1, two dummy memory cell transistors 606, 608 connected respectively to DWLS0 and DWLS1, two dummy memory cell transistors 626, 628 connected respectively to DWLD0 and DWLD1, a drain-side select gate transistor 630 connected to SGD1, a drain-side select gate transistor 632 connected to SGD0. Drain-side select gate transistor 632 is connected to a bit line (BL). First source-side select gate transistor 602 is connected to a source line (SL). In one embodiment, there is a dummy memory cell transistor on each side of each middle junction transistor 614, 618.

According to different embodiments, each middle junction transistor 614, 618 may be a programmable transistor, such as a floating gate transistor or a charge trap transistor, or a non-programmable transistor, such as an NMOS transistor or a PMOS transistor. Each middle junction transistor 614, 618 may comprise an NMOS transistor without a charge trap layer between the channel of the NMOS transistor and the gate of the NMOS transistor. In certain embodiments, one middle junction transistor 614, 618 may comprise a programmable transistor and another middle junction transistor 614, 618 may comprise a non-programmable transistor. Each middle junction transistor 614, 618 may have a transistor channel length that is different from the transistor channel lengths used for the memory cell transistors. The channel length may be greater than any of the transistor channel lengths used for the memory cell transistors. For example, the channel length may be three times greater than the transistor channel lengths used for the memory cell transistors. Each middle junction transistors 614, 618 may electrically isolate the memory cell transistors in different vertical sub-blocks when the middle junction transistor is set into a non-conducting state.

Although the example memory system of FIGS. 3-4H is a three dimensional memory structure that includes vertical NAND strings with charge-trapping material, other (2D and 3D) memory structures can also be used with the technology described herein. Different operations for accessing data in non-volatile memory cells (e.g., read, program, program verify) that are described below may be applied to one or more of the example memory systems described above with respect to FIGS. 1-4H.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. For example, when data is written to a set of memory cells, some of the memory cells will need to store data associated with an erased state so they will not be programmed. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming.

Figure 5:
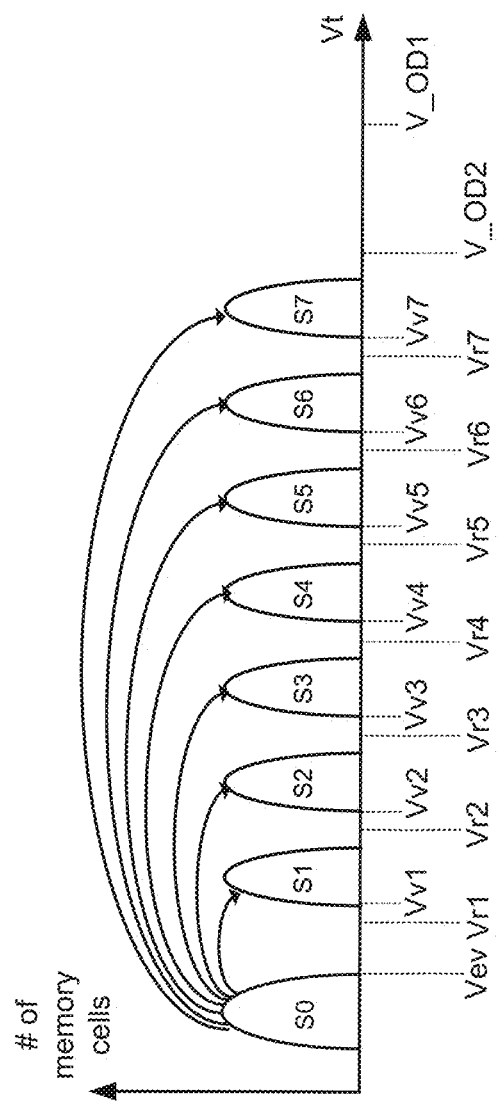
FIG. 5 illustrates example threshold voltage distributions for the memory array when each memory cell stores three bits of data.

FIG. 5 shows threshold voltage distributions for eight data states, S0 to S7, corresponding to three bits of data per cell (Three Level Cell, or TLC). Also shown are seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7 used in read verify steps during a programming operation. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7. FIG. 6 also shows Vev, which is a voltage level to test whether a memory cell has been properly erased (e.g., whether a memory cell is in the S0 data state).

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. In some embodiments, data states S1-S7 can overlap, with controller 122 relying on error correction to identify the correct data being stored.

The technology described herein can also be used with other types of programming in addition to full sequence programming (including, but not limited to, multiple stage/phase programming). In one embodiment of multiple stage/phase programming, all memory cell to end up in any of data states S4-S7 are programmed to an intermediate state that is no higher than S4 in a first phase. Memory cells to end up in any of data states S0-S3 do not receive programming in the first phase. In a second phase, memory cells to end up in either data state S2 or S3 are programmed to a state that is no higher than S2; memory cells to end up in either data state S6 or S7 are programmed to a state that is no higher than S6. In at third phase, the memory cells are programmed to their final states. In one embodiment, a first page is programmed in the first phase, a second page is programmed in the second phase, and a third page is programmed in the third phase. Herein, once one page has been programmed into a group of memory cells, the memory cells can be read back to retrieve the page. Hence, the intermediate states associated with multi-phase programming are considered herein to be programmed states.

In general, during sensing of verify and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 5) or verify operation (e.g. see verify target levels Vv1, Vv2, Vv3, Vv4, Vv5, Vv6, and Vv7 of FIG. 5) in order to sense whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during sensing in a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for sensing during verify or read operations. Other read and verify techniques known in the art can also be used.

FIG. 5 also shows two examples of overdrive voltages V_OD1 and V_OD2, which may be applied to control gates of data memory cells. Both overdrive voltages are above all of the data states S0-S7. Therefore, the overdrive voltages will be above the threshold voltage of a data memory cell that is in any of the data states S0-S7. The overdrive voltages, when applied to a control gate of a data memory cell during memory access (e.g., during a program step or program verify step of a program operation, or during a read step of a read operation), are sufficient to cause the memory cell to operate as a pass gate (e.g., conduct a current or "turn on") whether the memory cell is in a programmed state (e.g., S1-S7) or an erased state (e.g., S0). In some examples, two different overdrive voltages (e.g., V_OD1 and V_OD2) are applied to different word lines connected to the same NAND string during a program or sensing (read or verify) operation. For example, first overdrive voltage V_OD1 may be applied to unselected word lines connected to memory cells in a selected sub-block while a second (e.g., lower) overdrive voltage V_OD2 may be applied to unselected word lines connected to programmed memory cells in one or more unselected sub-blocks when accessing memory cells connected to the selected word line in the selected sub-block.

The system uses one or more "bypass voltage" during memory access, in one embodiment. Bypass voltages are at least Vev, but no greater than Vv7, in one embodiment. For example, the bypass voltages could be Vr1, Vv1, Vv2, etc. Thus, the bypass voltages, when applied to a control gate of a data memory cell during a pre-charge phase of a programming operation, will cause the memory cell to operate as a pass gate (e.g., become conductive or "turn on") if the memory cell is in an erased state, but not act as a pass gate for at least one programmed state.

Figure 6A:
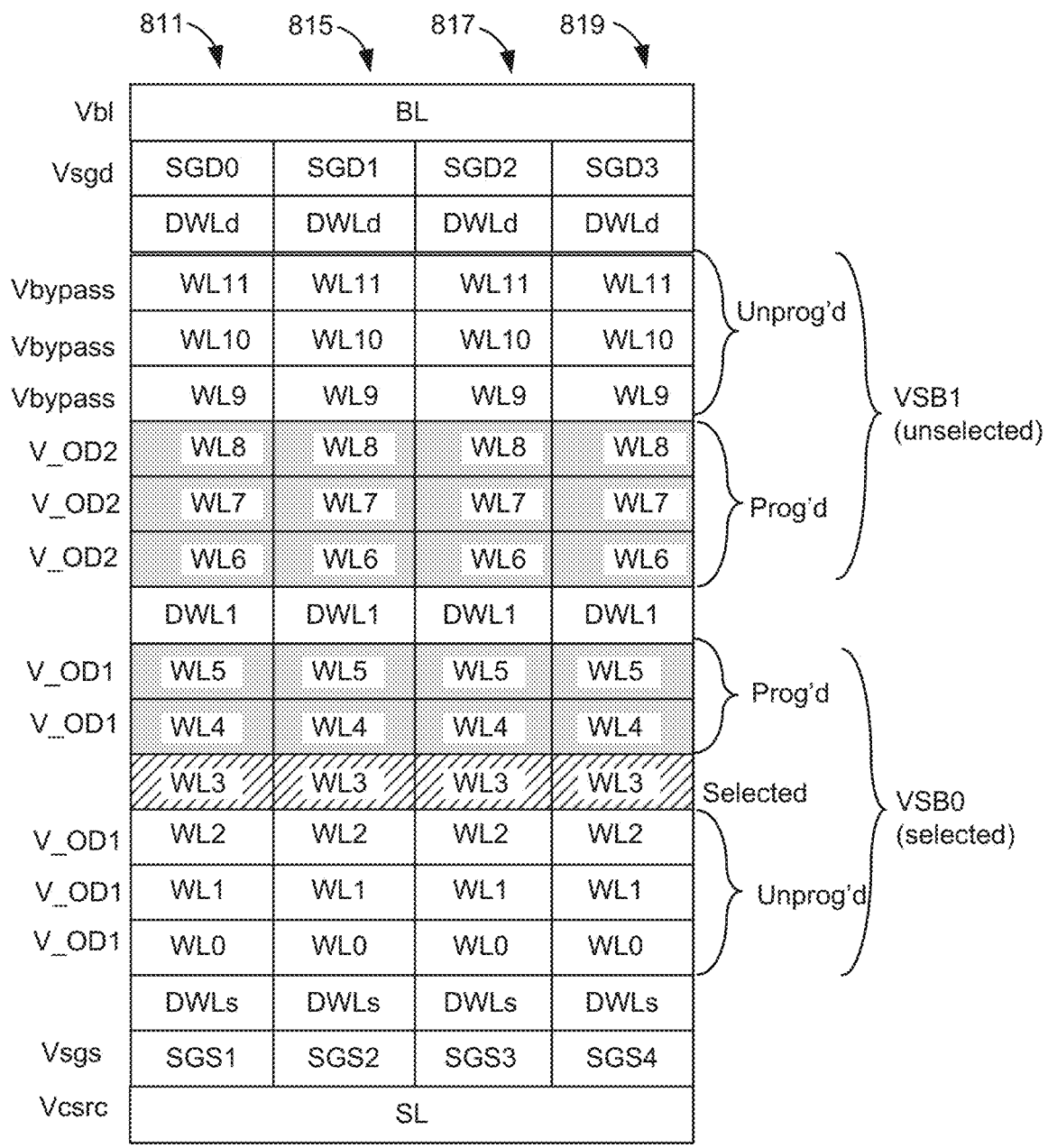

FIG. 6A illustrates an example of a portion of a memory structure (e.g., of memory structure 126 or 326) that includes two vertical sub-blocks, VSB0 and VSB1, that include non-volatile memory cells connected in series in NAND strings 811, 815, 817, 819. First vertical sub-block VSB0 includes first word lines WL0-WL5. Second vertical sub-block VSB1 includes second word lines WL6-WL11. First and second word lines WL0-WL5 and WL6-WL11 are data word lines and are separated by a non-data word line (dummy word line DWL1) which is coupled to non-data transistors. NAND strings 811, 815, 817, 819 are connected to bit lines (BL) at the top and to a source line (SL) at the bottom.

In the example of FIG. 6A, first vertical sub-block VSB0 includes a selected word line, WL3, and may therefore be referred to as a selected sub-block. VSB0 includes unselected word lines WL4 and WL5, which are connected to programmed memory cells and unselected word lines WL0 to WL2, which are connected to unprogrammed memory cells (memory cells along selected word line WL3 may be programmed, unprogrammed, or partially-programmed, e.g., WL3 may be undergoing a programming operation which may include program steps and verify steps).

Second vertical sub-block VSB1 is an unselected sub-block in this example. Because NAND strings 811, 815, 817, 819 extend through first and second sub-blocks VSB0 and VSB1, these sub-blocks are connected, and both sub-blocks (not only the selected sub-block) may be appropriately biased when accessing the selected sub-block. For example, when accessing selected word line WL3 in VSB0, appropriate voltages may be applied to second word lines WL6 to WL11 of VSB1 to ensure that NAND strings 811, 815, 817, 819 are sufficiently conductive. Similarly, when accessing a word line in VSB1, appropriate voltages may be applied to first word lines WL0 to WL5 to ensure that NAND strings 811, 815, 817, 819 are sufficiently conductive.

Accessing (e.g., reading or programming) memory cells along a NAND string may affect other memory cells along the NAND string. In a structure that includes NAND strings extending between two or more sub-blocks, accessing memory cells in one sub-block may affect memory cells in a connected sub-block. For example, disturbance of stored data may occur as a result of repeated reads (read disturb) or repeated writes (write disturb). These effects may be particularly problematic where sub-blocks are separately managed (e.g., contain logically unrelated data and are independently written and erased). In such a scenario, one sub-block may be repeatedly written, read, and erased while a connected sub-block continues to store the same data, which may be disturbed by repeated access to its neighboring sub-block. Disturbance may have greater impact in memory structures that store more than one bit per cell (e.g., because of narrow threshold voltage ranges for different data states). Thus, reducing disturb effects may be particularly beneficial in structures that are arranged in sub-blocks and in memory structures storing more than one bit per cell (e.g., TLC arrangement illustrated in FIG. 5).

FIG. 6A shows an example of voltages that may be applied to unselected word lines of both a selected sub-block (VSB0) and an unselected sub-block (VSB1) in order to mitigate interactions between sub-blocks. For example, using a bias scheme according to examples presented here may address technical problems of disturbance in memory structures that have multiple sub-blocks. Voltages applied to different lines are shown to the left of the corresponding lines. In the selected sub-block, all unselected word lines (WL0-WL2 and WL4-WL5) receive a first overdrive voltage V_OD1 applied so that all memory cells along the unselected word lines are turned on (whether memory cells are programmed or not). V_OD1 may be a relatively high voltage that boosts channel voltage in on either side of the selected word line WL3 in the selected sub-block.

In the unselected sub-block VSB1, a second overdrive voltage V_OD2 is applied to all word lines that are connected to programmed memory cells (WL6-WL8). Second overdrive voltage V_OD2 may be a lower voltage than first overdrive voltage V_OD1 (e.g., as illustrated in FIG. 5). Word lines that are connected to unprogrammed memory cells (WL9-WL11) receive a bypass voltage (Vbypass) that is sufficient to turn on unprogrammed memory cells found along WL9-WL11. Using relatively low voltages in unselected sub-block VSB1 as illustrated (V_OD2 less than V_OD1, and Vbypass less than V_OD2 and V_OD1) may generally reduce unwanted interactions between sub-blocks and result in less disturbance and thereby provide lower error rates (particularly in memory structures storing more than one bit per cell).

While FIG. 6A shows an example of two connected sub-blocks that are programmed in a middle-out sequence (programming from DWL1), VSB0 and VSB1, aspects of the present technology may be applied to any suitable memory, for example, any number of connected sub-blocks, any number of word lines per sub-block, storing any number of bits per cell, and using any suitable programming sequence.

FIG. 6B illustrates an example of a portion of a memory structure (e.g., of memory structure 126 or 326) that includes NAND strings 811, 815, 817, 819 extending through three vertical sub-blocks, VSB0, VSB1 and VSB2. First vertical sub-block VSB0 includes first word lines WL0-WL5. Second vertical sub-block VSB1 includes second word lines WL6-WL11. Third vertical sub-block VSB2 includes third word lines WL 12-WL17. First and second word lines WL0-WL5 and WL6-WL11 are data word lines and are separated by a non-data word line (dummy word line DWL1) which is coupled to non-data transistors. Third word lines WL12-WL17 are data word lines and are separated from second word lines WL6-WL11 by a non-data word line (dummy word line DWL2) which is coupled to non-data transistors. NAND strings 811, 815, 817, 819 are connected to bit lines (BL) at the top and to a source line (SL) at the bottom.

In the example illustrated in FIG. 6B, the selected word line WL7 (e.g., target for reading or writing) is located in VSB1 so that VSB1 is the selected sub-block with VSB0 and VSB2 being unselected sub-blocks. Control circuits apply a first overdrive voltage V_OD1 on unselected word lines of the selected sub-block (WL6 and WL8-WL11 of VSB1) to turn on corresponding memory cells and boost the channels in the selected sub-block VSB1. In both unselected sub-blocks, VSB0 and VSB2, word lines connected to programmed memory cells receive a second overdrive voltage, V_OD2, and word lines connected to unprogrammed memory cells receive a bypass voltage, Vbypass. For example, in VSB0, WL0-WL3 receive V_OD2 while WL4-WL5 receive Vbypass. In VSB2, WL12-WL14 receive V_OD2 while WL15-WL17 receive Vbypass. Thus, in this example, the same biasing scheme is applied to all unselected sub-blocks (biasing scheme with different voltages for programmed and unprogrammed memory cells). In other examples, different biasing may be applied to word lines of different sub-blocks. Such biasing schemes may be extended to any number of sub-blocks, each containing any number of word lines, NAND strings and other components, and the present technology is not limited to the illustrated examples.

Figure 7A:
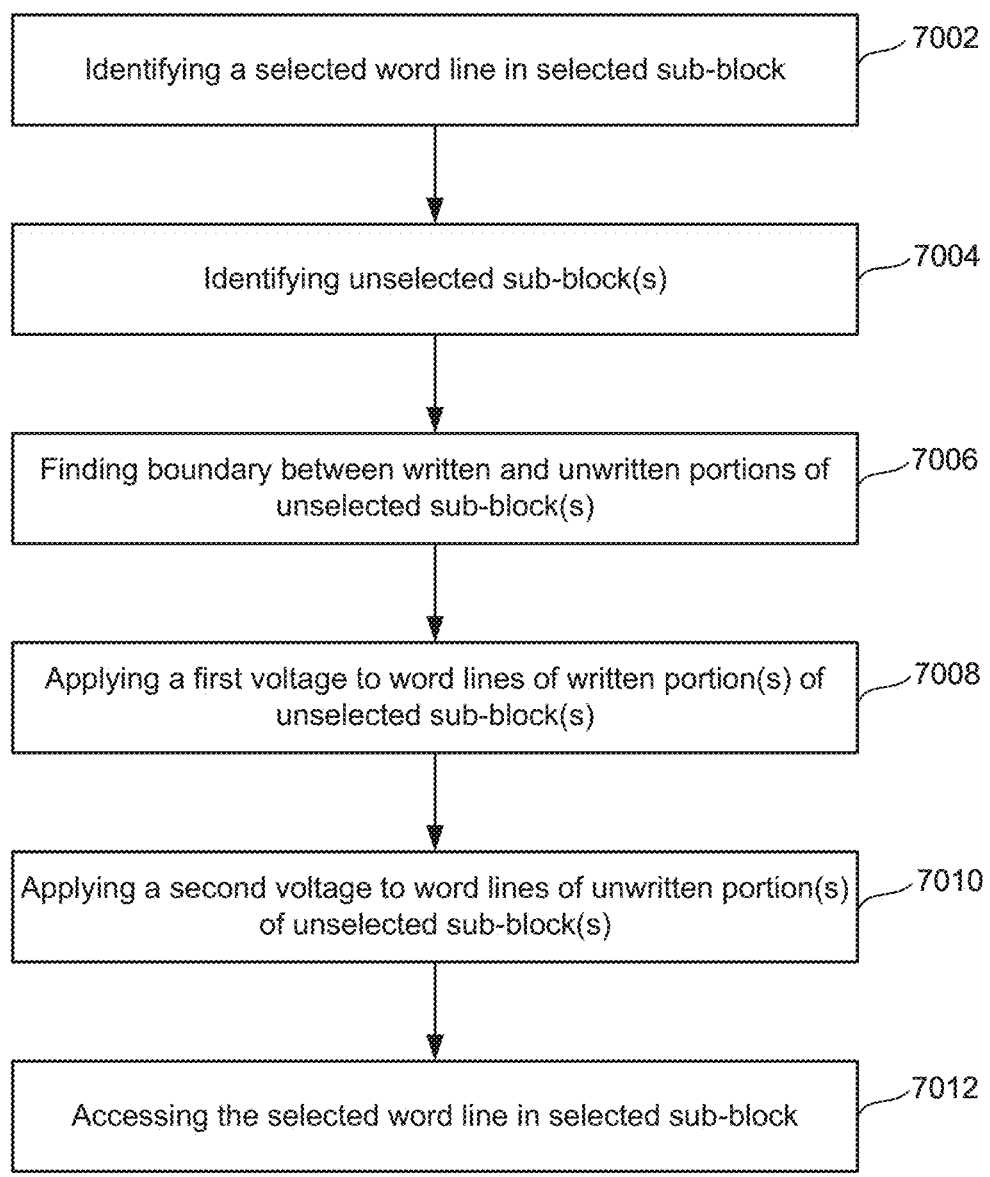

FIG. 7A illustrates an example of accessing a selected word line in a selected vertical sub-block of any suitable memory structure (e.g., memory structure 126 or 326) that applies at least two different voltages to word lines of one or more unselected vertical sub-block (e.g., as illustrated in FIGS. 6A-B). The illustrated steps of this method and other methods described below may be carried out by one or more suitable control circuit (e.g., control circuits 110 and/or read/write circuits 128; system control logic 360, row control circuitry 320, and/or column control circuitry 364; or other suitable control circuits, which may be on the same die as the memory structure being accessed, on a different die, or some combination). The method includes the step of identifying a selected word line in a selected sub-block 7002 (e.g., a word line that is connected to memory cells that are to be programmed or read) and identifying unselected sub-block(s) 7004 that are connected to the selected sub-block (e.g., as illustrated in FIGS. 6A-B). The method also includes finding the boundary between written and unwritten portions of unselected sub-block(s) 7006, applying a first voltage to word lines of written portion(s) of the unselected sub-block(s) 7008, applying a second voltage to word lines of unwritten portion(s) of unselected sub-block(s) 7010. The boundary may be found by any suitable method and examples are described below. In some cases, a sub-block may be completely written or completely unwritten in which case a single voltage (either first or second voltage as appropriate) may be applied to all word lines of a sub-block. The method further includes accessing the selected word line in the selected sub-block 7012 while applying the first and second voltages to word lines of unselected block(s) (while steps 7008, 7010, and 7012 are illustrated in a sequence, the first and second voltages are maintained over a period of time that includes accessing the selected sub-block). Accessing may mean, for example, programming memory cells along the selected word line (e.g., by applying one or more programming pulse to the selected word line) or sensing memory cells along the selected word line (e.g., as a program-verify step during a programming operation or as part of a read operation to obtain data requested by a read command). Suitable voltages may be applied to other components (e.g., to unselected word lines of the selected sub-block, dummy word lines, select lines, bit lines, and select lines) during such accessing operations.

Figure 7B:
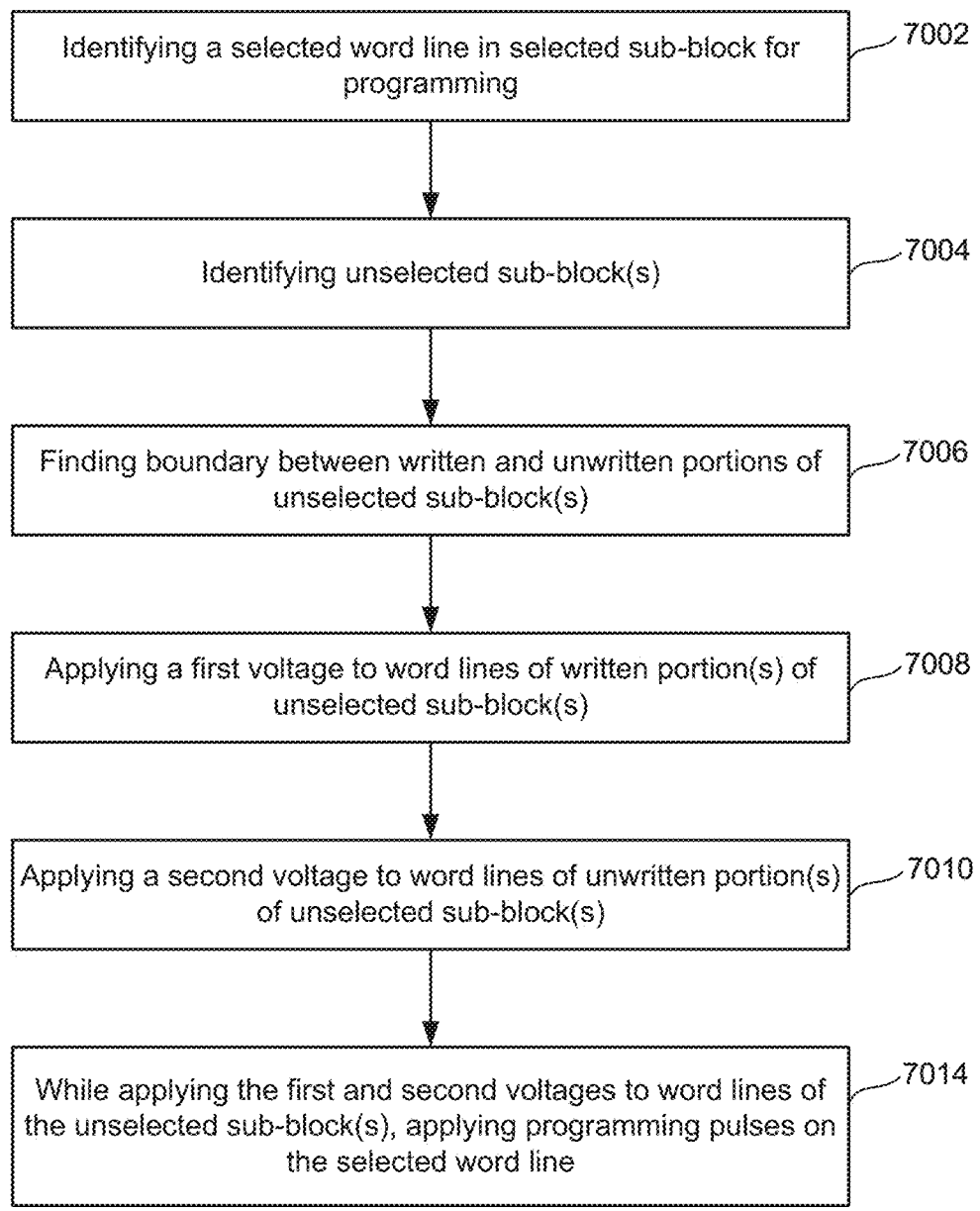

FIG. 7B illustrates an example of the method of FIG. 7A used for programming memory cells connected to a selected word line. Step 7002 includes identifying a selected word line in a selected sub-block for programming (e.g., in response to a program command specifying a particular word line in a memory structure as a destination for data storage). The method includes identifying unselected sub-block(s) 7004 that are connected to the selected sub-block, finding the boundary between written and unwritten portions of unselected sub-block(s) 7006, applying a first voltage to word lines of written portion(s) of the unselected sub-block(s) 7008, and applying a second voltage to word lines of unwritten portion(s) of unselected sub-block(s) 7010 as previously described. The method further includes, while applying the first and second voltages to word lines of unselected sub-block(s), applying a sequence of programming pulses on the selected word line 7014. For example, while applying V_OD2 and Vbypass as illustrated in FIGS. 6A-B, applying one or more programming pulses to raise threshold voltages of memory cells as illustrated in FIG. 5.

FIG. 7C illustrates an example of the method of FIG. 7A used for verifying or reading memory cells connected to a selected word line. Step 7002 includes identifying a selected word line in a selected sub-block for a verify or read. For example, such verify step may occur during programming of memory cells connected to the selected word line after a programming step such as illustrated in FIG. 7B so that the selected word line is indicated by a program command. Such program steps and verify steps may be performed alternately until completion of a programming operation. A selected word line for a read may be indicated by a read command (e.g., a command to read and return data stored in memory cells along a specific word line). The method includes identifying unselected sub-block(s) 7004 that are connected to the selected sub-block, finding the boundary between written and unwritten portions of unselected sub-block(s) 7006, applying a first voltage to word lines of written portion(s) of the unselected sub-block(s) 7008, and applying a second voltage to word lines of unwritten portion(s) of unselected sub-block(s) 7010 as previously described. The method further includes, while applying the first and second voltages to word lines of unselected sub-block(s), sensing memory cells connected to the selected word line. For example, while applying V_OD2 and Vbypass as illustrated in FIGS. 6A-B, sensing memory cells along the selected word line by applying one or more read verify voltages Vv1-Vv7 of FIG. 5 on the selected word line while sensing current through NAND strings 811, 815, 817, 819 in a verify step or applying one or more read voltages Vr1-Vr7 on the selected word line while sensing current through NAND strings 811, 815, 817, 819 in a read step.

Figure 7D:
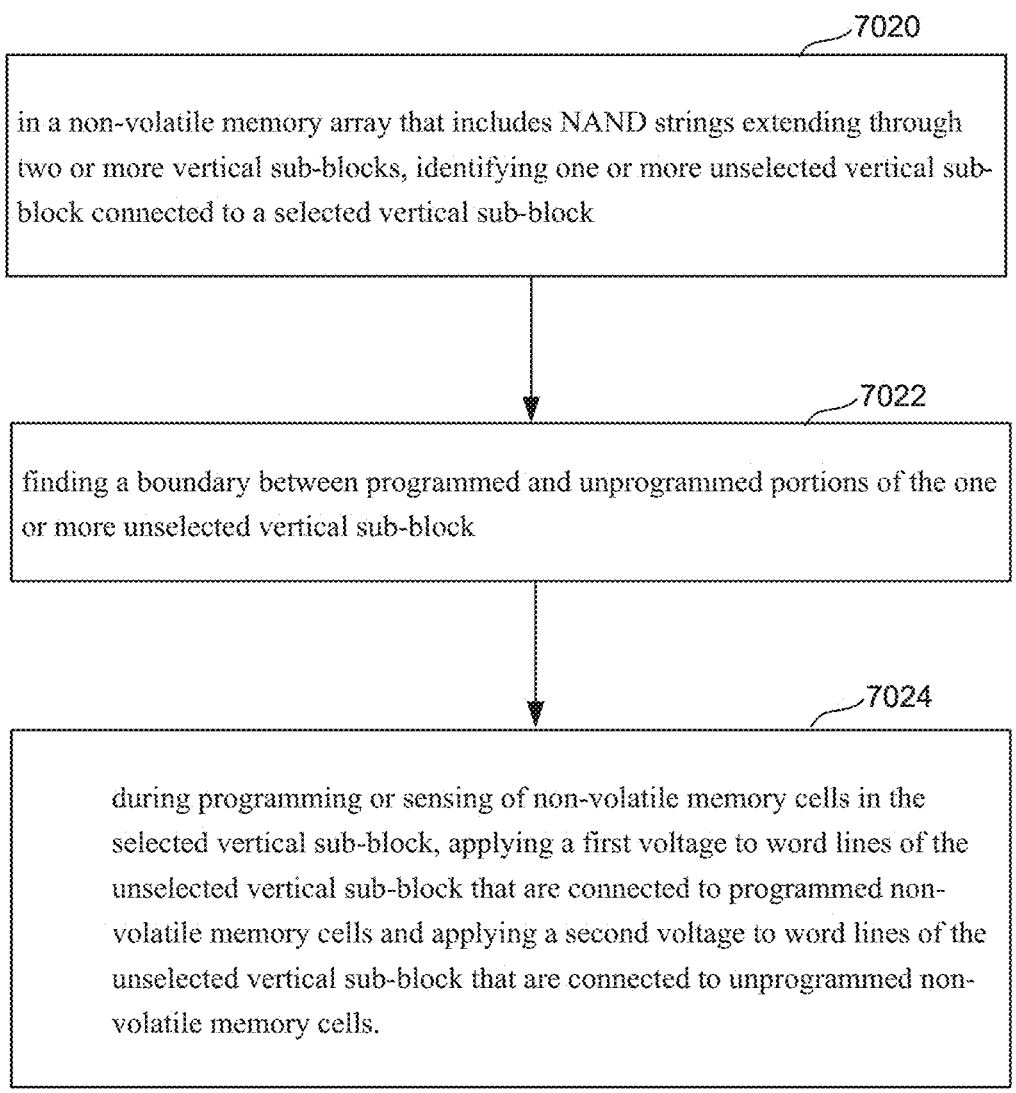

FIG. 7D illustrates an example of a method of using the present technology in a structure such as illustrated in the examples of FIGS. 6A-B. The method includes, in a non-volatile memory array that includes NAND strings extending through two or more vertical sub-blocks, identifying one or more unselected vertical sub-block connected to a selected vertical sub-block 7020, finding a boundary between programmed and unprogrammed portions of the one or more unselected vertical sub-block 7022 and during programming or sensing of non-volatile memory cells in the selected vertical sub-block, applying a first voltage to word lines of the unselected vertical sub-block that are connected to programmed non-volatile memory cells and applying a second voltage to word lines of the unselected vertical sub-block that are connected to unprogrammed non-volatile memory cells 7024.

The steps illustrated in FIG. 7D may be carried out by any suitable control circuit(s) including, for example control circuit 110 and/or read/write circuits 128; system control logic 360, row control circuitry 320, and/or column control circuitry 364. Such control circuits may be considered examples of means for applying a read voltage or a programming pulse on a selected word line of a first set of data word lines to read or program memory cells along the selected word line while applying an overdrive voltage to all programmed data word lines in a second set of data word lines and applying a bypass voltage to all unprogrammed data word lines in the second set of data word lines Boundaries between written and unwritten portions of unselected sub-block(s) may be found in any suitable manner. In some memory systems, control information may be maintained indicating certain information about sub-blocks. For example, control information may indicate if a block is fully programmed (closed), partially programmed (open), or entirely unprogrammed (erased). In the case of closed or erased unselected sub-blocks, all word lines may be treated similarly, and the same voltage may be applied to all such word lines (e.g., a suitable overdrive voltage such as V_OD2 may be applied to all word lines of a closed block and a suitable bypass voltage such as Vbypass may be applied to all word lines of an erased block). In the case of an open sub-block, control information may indicate where the boundary between written and unwritten portions is located. In this case, finding the boundary may include accessing the relevant control information. In other cases, such control information is unavailable or is not reliable (e.g., after an unscheduled loss of power when control information may not have been saved from volatile to non-volatile memory prior to loss of power) and an unselected sub-block may be searched to find the boundary.

Figure 8A:
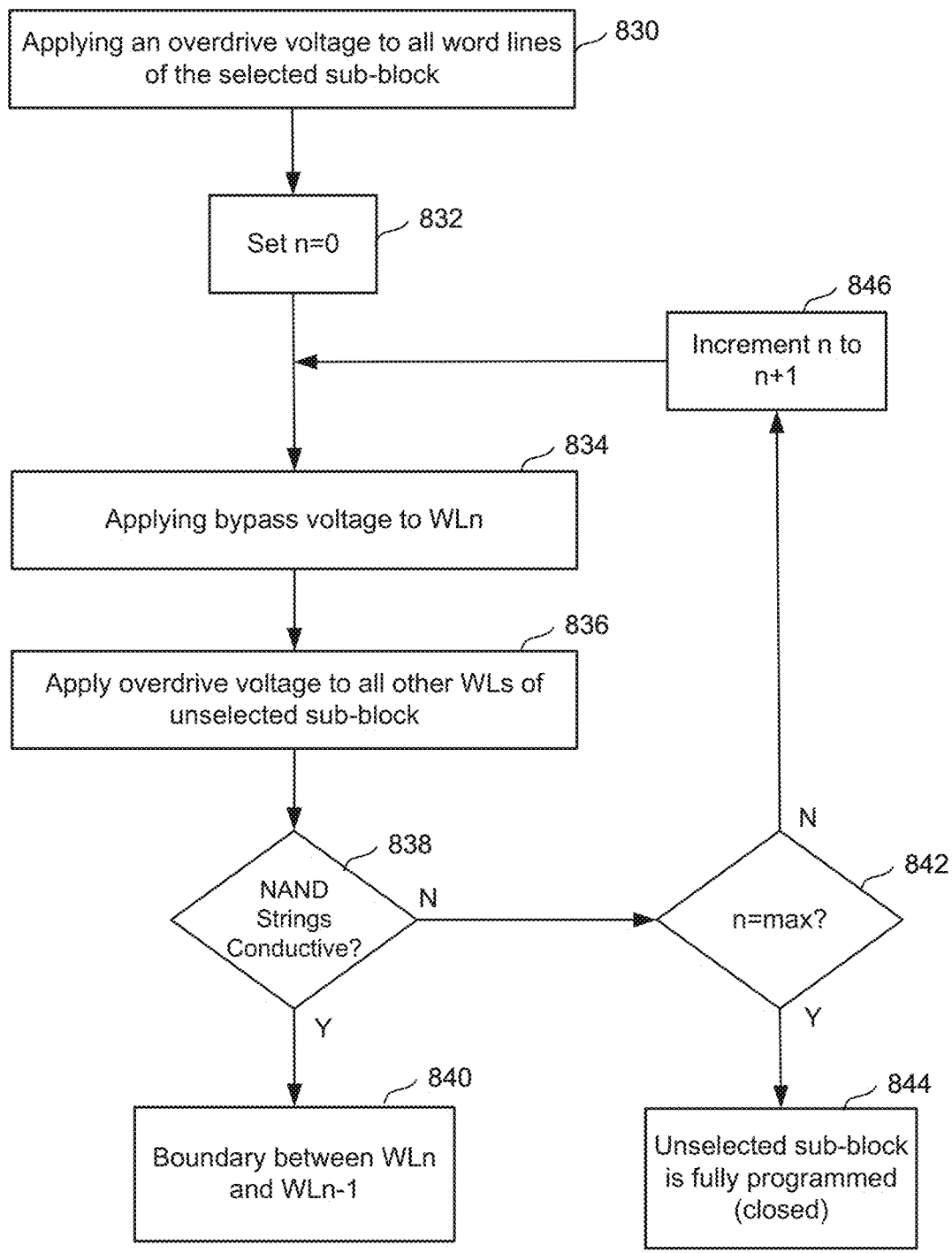
FIGS. 8A-C illustrate methods of finding a boundary between programmed and unprogrammed portions of an open sub-block.

FIG. 8A shows a first example of a method of searching an unselected sub-block that is connected to a selected sub-block (e.g., a method for finding the boundary in step 7006 of FIGS. 7A-C). The method includes applying an overdrive voltage to all word lines of the selected sub-block 830 (e.g., applying first overdrive voltage V_OD1 to WL6-WL11 of VSB1 in FIG. 6B). An overdrive voltage (e.g., 7 volts) may also be applied to all word lines of any other unselected sub-blocks other than the sub-block being searched so that all memory cells of connected NAND strings outside the sub-block being searched are conductive (e.g., word lines WL12-WL17 of unselected sub-block VSB2 may receive an overdrive voltage such as V_OD1 or VOD2 when searching for a boundary in unselected sub-block VSB0 of FIG. 6A). The method includes setting a variable "n" to zero (n=0) 832, where n indicates the word line being checked as programmed/unprogrammed, applying a bypass voltage (e.g., 0 volts) to WLn of the unselected sub-block 834, and applying an overdrive voltage (e.g., 7 volts) to all other word lines of the unselected sub-block 836. A determination is then made as to whether the NAND strings are conducting 838 (e.g., by measuring current flow through NAND strings 811, 815, 817, 819). Because some memory cells remain in the S0 data state even when memory cells are programmed, a single conducting NAND string may not be sufficient to indicate an unprogrammed condition of memory cells along a word line. Results from sensing multiple NAND strings may be used (e.g., an average current, a number of NAND strings exceeding an expected current, or some other combination of results). If the NAND strings are conductive with a bypass voltage applied on WLn, then WLn is connected to unprogrammed memory cells and the boundary is between WLn and WLn−1 840. If NAND strings are conductive for n=0 (first word line of the sub-block) then the block is erased and a bypass voltage (e.g., Vbypass) may be applied to all word lines of the unselected sub-block when accessing the selected word line of the selected sub-block. If the NAND strings are not conductive, then it is determined whether word line WLn was the last word line of the sub-block, n=max? 842. If n=max then the unselected sub-block is fully programmed (closed) 844, and an overdrive voltage (e.g., V_OD2) may be applied to all word lines of the unselected sub-block while accessing the selected word line of the selected sub-block. If WLn is not the last word line (n max) then n is incremented to n+1 846 and the next word line is checked until a boundary is found, or the last word line is reached.

The order of checking word lines proceeds in the order of programming. Thus, for example, in FIG. 6B, the first word line to check in unselected sub-block VSB0 may be WL0, followed by WL1, WL2 and so on so that the numbering shown indicates the order of checking. A bypass voltage applied to any of WL0 to WL3 is insufficient to make NAND strings 811, 815, 817, 819 conductive (at least on average) because they are programmed and have higher threshold voltages (e.g., corresponding to data states S1-S7 of FIG. 5). A bypass voltage applied to WL4 is sufficient to make NAND strings 811, 815, 817, 819 conductive because only unprogrammed memory cells are connected to WL4. Thus, applying the method of FIG. 8A to VSB0 of FIG. 6B includes incrementing n until n=4, and finding the boundary between WL3 and WL4. When searching for a boundary in unselected sub-block VSB2, WL12 may be the first word line checked, followed by WL13, WL14, and so on. The value of n may be offset accordingly (e.g., n may be initialized to 12 instead of zero). In some cases (e.g., using center-out programming) word lines may be checked in a different order with some sub-blocks checked from the lowest word line to the highest and others checked from the highest to the lowest according to the programming sequence (e.g., n may be offset and may be decremented instead of incremented in some sub-blocks).

While proceeding sequentially one word line at a time as illustrated in FIG. 8A is one way to find the boundary, another way to find the boundary uses a binary search tree, which may reduce the number of steps to find the boundary. According to this approach, a word line in the middle of a sub-block is checked first to determine which half of the sub-block contains the boundary. Then, a word line in the middle of that half is checked to determine which quarter contains the boundary. Successive steps reduce the search area by half until the boundary is found.

Figure 8B:
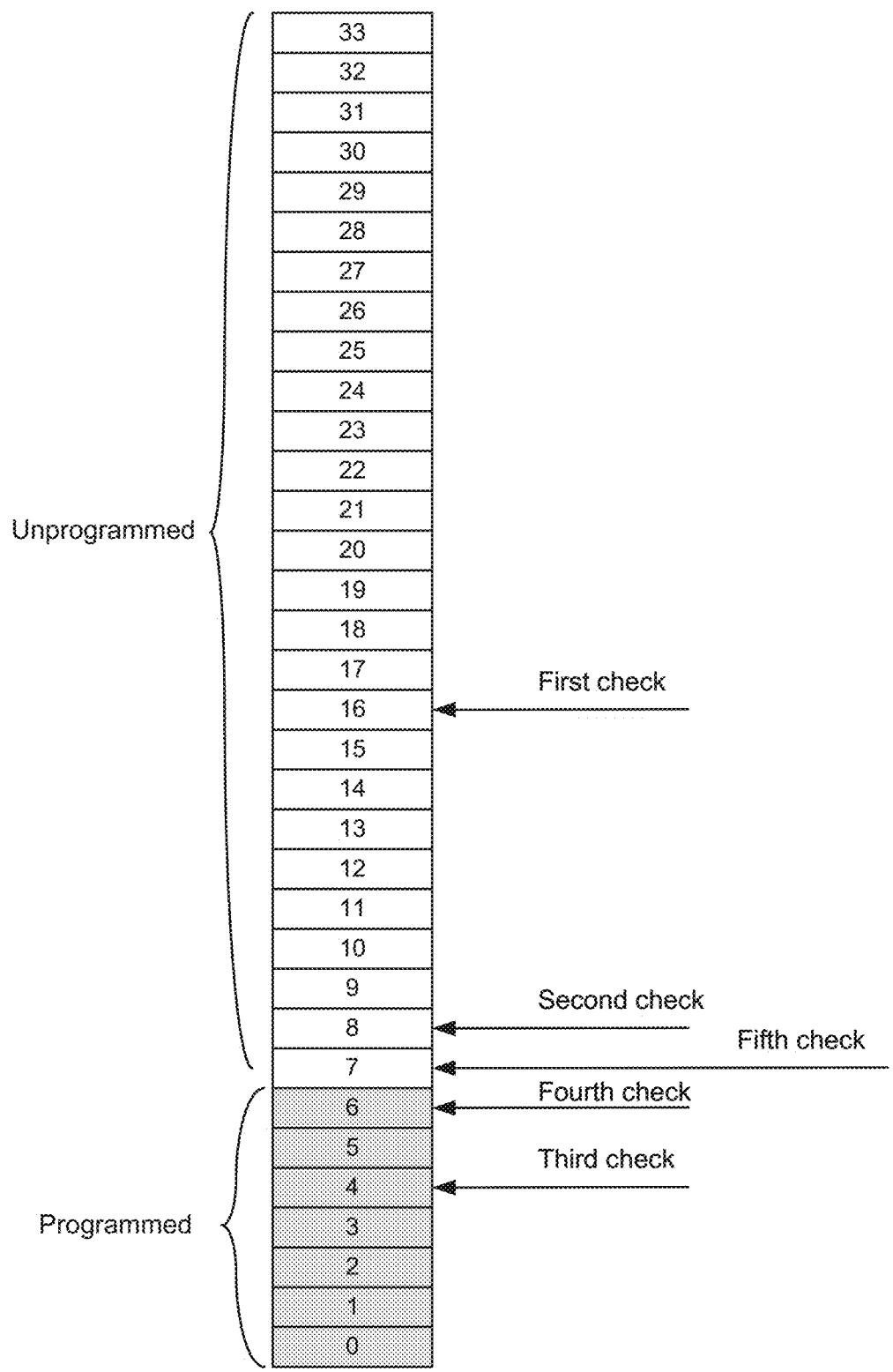

FIG. 8B illustrates a sub-block that has 34 word lines including 7 word lines (0-6) connected to memory cells that are programmed and 25 word lines (7-33) connected to memory cells that are unprogrammed. Using a sequential search may require seven sensing operations corresponding to word lines 0-7 (proceeding in the order of programming from word line 0). If the boundary was higher, a larger number of steps would be required (e.g., if boundary location is random, on average the boundary would be between word lines 16 and 17, requiring 18 sequential steps to find). In contrast, using a binary search approach includes a first check at the middle of the sub-block at word line 16, which is not programmed, indicating that the boundary is in the lower half of the sub-block (between 0 and 16). A second check at the middle of the lower half, at word line 8, indicates that the boundary is in the lower quarter of the sub-block (between 0 and 8). A third check at the middle of the lower quarter, at word line 4, indicates that the boundary is in the upper part of the lower quarter (between 4 and 8). A fourth check at the middle of the upper part of the lower quarter, at word line 6, indicates that the boundary is above word line 6 (between 6 and 8). A fifth check of word line 7 indicates that the boundary is below word line 7 so that the boundary is determined to be between word line 6 and word line 7 (e.g., word lines 0-6 are connected to programmed memory cells and word lines 7-33 are connected to unprogrammed memory cells).

Figure 8C:
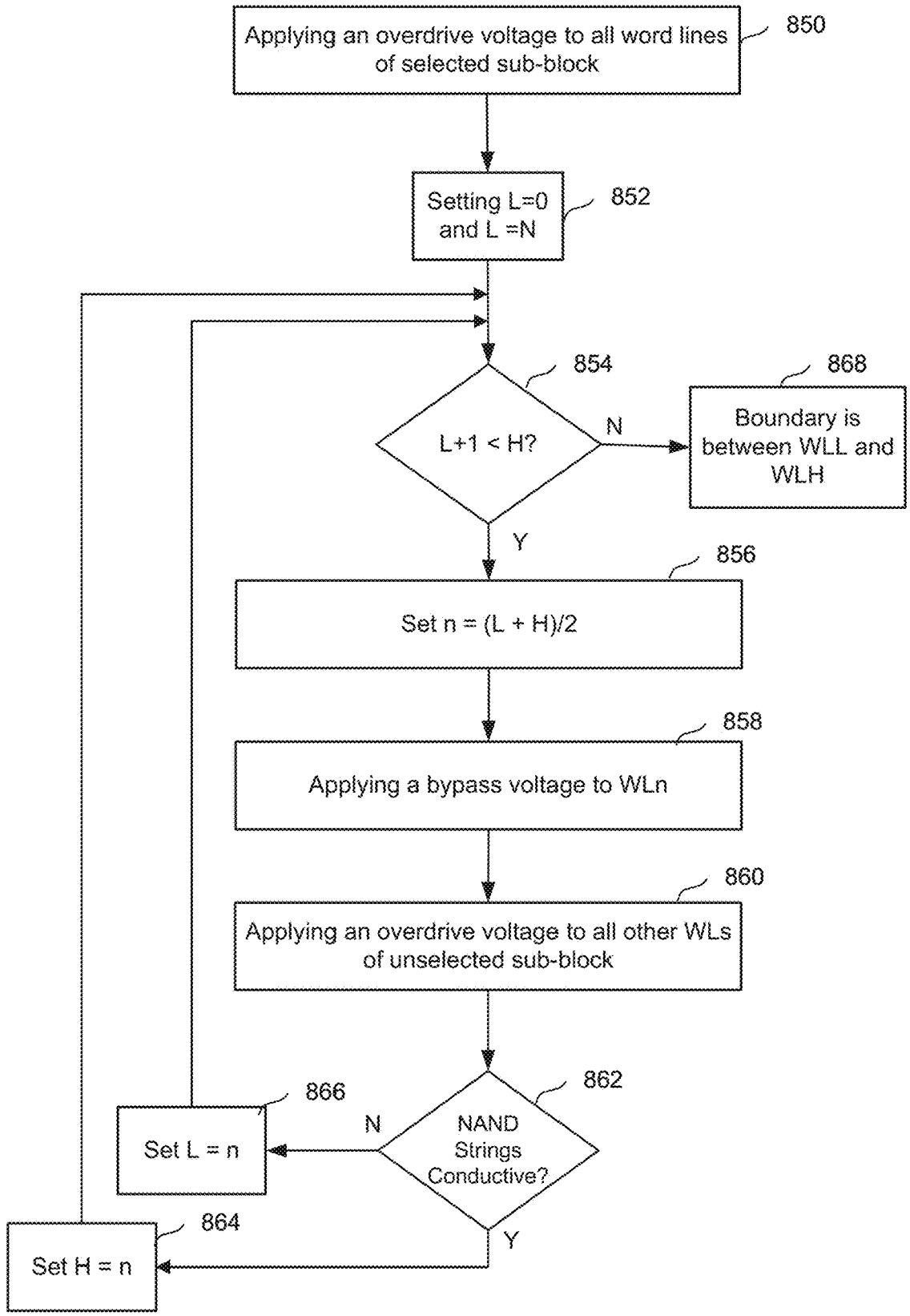

FIG. 8C illustrates a method of implementing a binary search operation (e.g., binary search operation illustrated in FIG. 8B applied to unselected sub-block(s) of FIG. 6A or 6B). The method includes applying an overdrive voltage to all word lines of a selected sub-block 850 (e.g., sub-block containing the selected word line for programming or sensing) and setting a first variable L to 0 and a second variable H to N: Setting L=0 and L=N 852. These variables correspond to the lowest word line (WLL) in the range to be searched and the highest word line (WLH) in the range to be searched respectively. They are initialized to the lowest word line in the sub-block (WL0) and the highest word line in the sub-block (WLN where there are N+1 word lines in the sub-block, e.g., N=33 in the example of FIG. 8B). Thus, the initial range to be searched includes all word lines of the sub-block. A determination is made as to whether L+1 is less than H 854 and, if it is (e.g., at initialization L+1=1, 1<34) then a variable n (corresponding to a word line to be checked) is set to (L+H)/2 856 (e.g., WL16, which is the target of the first check in FIG. 8A). The method includes applying a bypass voltage (e.g., 0 volts) to WLn 858, applying an overdrive voltage (e.g., 7 volts) to all other word lines of the unselected sub-block 860 and determining whether the NAND strings are conductive 862 (e.g., by sensing current through NAND strings). If NAND strings are conductive, then WLn is connected to unprogrammed memory cells so the boundary is located below WLn and the upper boundary of the next search area is set at WLn by setting H=n 864. If NAND strings are not conductive, then WLn is connected to programmed memory cells so the boundary is located above WLn and the lower boundary of the next search area is set at WLn by setting L=n 866. A determination as to whether L+1<H 854 is then made with the new value for H or L. If L+1 remains less than H (e.g., 1<16 after first check of FIG. 8B) then n is set to (L+H)/2 with the new value (e.g., n=8 for second check of FIG. 8B) and WLn is sensed by applying a bypass voltage to WLn 858, applying an overdrive voltage to all other word lines of the unselected sub-block 860 and determining if NAND strings are conductive 862. If the NAND strings are conductive then H is set to n 846 (e.g., after second check of FIG. 8B set n to 8 so that range is WL0 to WL8) and if the NAND strings are not conductive then L is set to n 866 (e.g., after third check of WL4 of FIG. 8A, set L to 4 so that range is from WL4 to WL8). The method proceeds until it is determined that L+1<H is not true at step 854 (e.g., when H is set to 7 after the fifth check, with L set to 6 from the fourth check, then L+1=H) then it is determined that the boundary is between WLL and WLH 868 (e.g., between WL6 and WL7 of FIG. 8B).

In some embodiments, results of a boundary search may be stored so that searching (e.g., as illustrated in FIGS. 8A-C) does not have to be repeated. For example, in a program operation that includes multiple program and verify steps, once a boundary is found in a sub-block it may be used throughout the programming operation (e.g., the location of the boundary may be stored by control circuits and retrieved as needed). Control circuits such as control circuits 110 and/or read/write circuits 128 may be configured to store such location information and apply word line voltages according to the stored location information.

Figure 9:
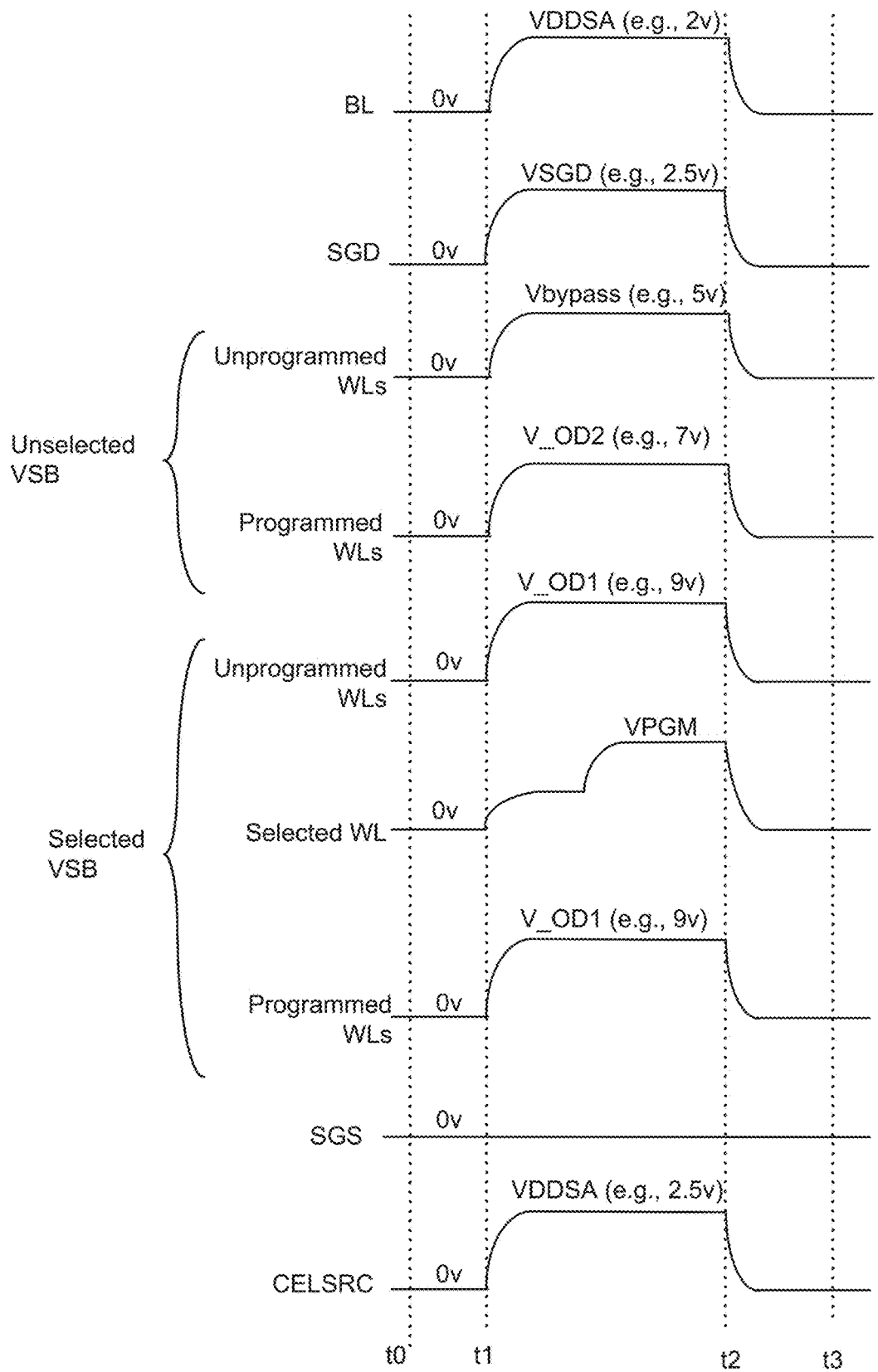
FIG. 9 is an example timing diagram for programming memory cells along a selected word line.

FIG. 9 is an example timing diagram showing certain voltages that may be applied by control circuits to program memory cells in a memory structure (e.g., by control circuits 110 and/or read/write circuits 128; system control logic 360, row control circuitry 320, and/or column control circuitry 364; or other suitable control circuits, which may be on the same die as the memory structure being accessed, on a different die, or some combination). The illustrated voltages include voltages applied to word lines of a selected vertical sub-block and one or more unselected vertical sub-block connected to the selected vertical sub-block (e.g., as illustrated in FIGS. 6A-B). Initially, at time t0, all illustrated voltages are at 0 volts. Subsequently, at time t1 bit line voltage (BL or Vbl) is increased to VDDSA (e.g., about 2-2.5 volts), drain select gate voltage (SGD or Vsgd) is increased to VSGD (e.g., 2.5 volts), source select gate voltage SGS remains at 0 volts, and source line voltage (CELSRC or Vcsrc) is increased to VDDSA (e.g., about 2-2.5 volts).

In the selected vertical sub-block (e.g., VSB0 of FIG. 6A) the voltage on the selected word line (e.g., WL3) is increased to VPGM (e.g., a programming pulse), the voltage on programmed word lines (e.g., word lines WL4-WL5 connected to programmed memory cells) is increased to a first overdrive voltage V_OD1 (e.g., between 8 and 10 volts or about 9 volts), and the voltage on unprogrammed word lines (e.g., word lines WL0-WL2 connected to unprogrammed memory cells) is also increased to V_OD1. In other examples, different voltages may be applied to word lines in the selected sub-block that are connected to programmed and unprogrammed memory cells.

In the unselected vertical sub-block (e.g., VSB1 of FIG. 6A) word lines connected to programmed memory cells (e.g., WL6-WL8) and word lines connected to unprogrammed memory cells (e.g., WL9-WL11) receive different voltages. Programmed and unprogrammed portions of such an unselected sub-block may be identified by any suitable method, including searching as described with respect to FIGS. 8A-C. An overdrive voltage of V_OD2 (e.g., a voltage less than the first overdrive voltage V_OD1, such as between 6 volts and 8 volts, or about 7 volts) is applied on programmed word lines. A bypass voltage (e.g., between 4 and 6 volts or about 5 volts is applied on unprogrammed word lines. All illustrated voltages are returned to 0 volts at time t2 and remain at 0 volts until at least t3 at which time a subsequent step may be performed (e.g., a verify step to determine whether the programming step was sufficient or another programming step is needed).

Figure 10:
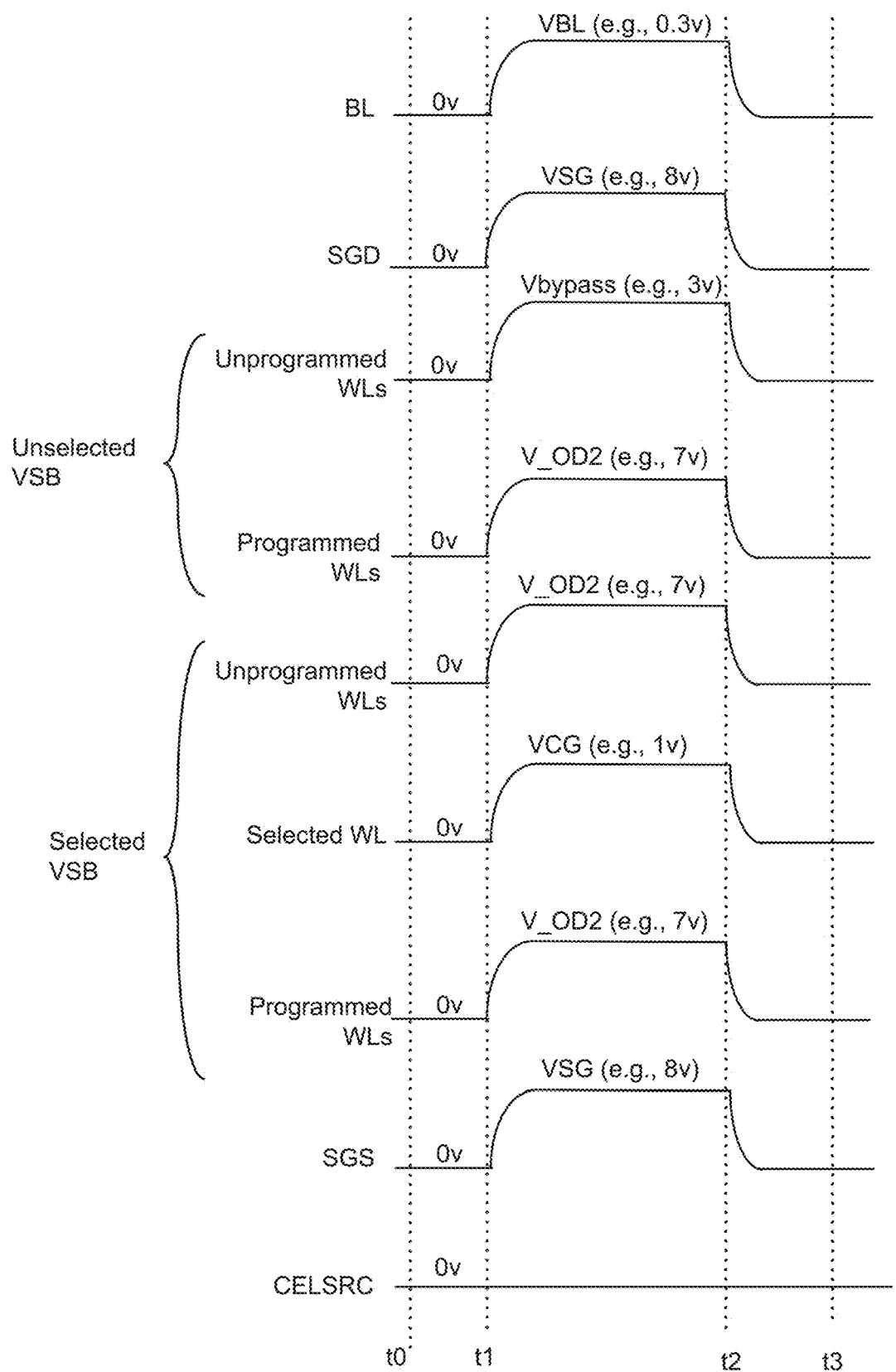
FIG. 10 is an example timing diagram for sensing memory cells along a selected word line.

FIG. 10 is an example timing diagram showing certain voltages that may be applied by control circuits to sense memory cells (e.g., during read or verify) in a memory structure (e.g., by control circuits 110 and/or read/write circuits 128; system control logic 360, row control circuitry 320, and/or column control circuitry 364; or other suitable control circuits, which may be on the same die as the memory structure being accessed, on a different die, or some combination). The illustrated voltages include voltages applied to word lines of a selected sub-block and one or more unselected sub-block connected to the selected sub-block (e.g., as illustrated in FIGS. 6A-B). Initially, at time t0, all illustrated voltages are at 0 volts. Subsequently, at time t1 bit line voltage (BL or Vbl) is increased to VBL (e.g., about 3 volts), drain select gate voltage (SGD or Vsgd) is increased to VSG (e.g., 8 volts), source select gate voltage SGS is also increased to VSG, and source line voltage (CELSRC or Vcsrc) is maintained at 0 volts.

In the selected vertical sub-block (e.g., VSB0 of FIG. 6A) the voltage on the selected word line (e.g., WL3) is increased to VCG (e.g., a read voltage Vr1-Vr7 or a verify voltage Vv1-Vv7, 1 volt in this example), the voltage on programmed word lines (e.g., word lines WL4-WL5 connected to programmed memory cells) is increased to an overdrive voltage V_OD2 (e.g., between 6 and 8 volts or about 7 volts), and the voltage on unprogrammed word lines (e.g., word lines WL0-WL2 connected to unprogrammed memory cells) is also increased to V_OD2. In other examples, different voltages may be applied to word lines in the selected sub-block that are connected to programmed and unprogrammed memory cells.

In the unselected vertical sub-block (e.g., VSB1 of FIG. 6A) word lines connected to programmed memory cells (e.g., WL6-WL8) and word lines connected to unprogrammed memory cells (e.g., WL9-WL11) receive different voltages. Programmed and unprogrammed portions of such an unselected sub-block may be identified by any suitable method, including searching as described with respect to FIGS. 8A-C. Overdrive voltage V_OD2 (e.g., a voltage between 6 volts and 8 volts, or about 7 volts) is applied on programmed word lines. A bypass voltage (e.g., between 2 and 4 volts or about 3 volts) is applied on unprogrammed word lines. All illustrated voltages are returned to 0 volts at time t2 and remain at 0 volts until at least t3 at which time a subsequent step may be performed (e.g., a subsequent program step if verify indicates further programming is needed or a subsequent read step with VCG at a different level).

One embodiment includes an apparatus comprising a control circuit configured to connect to first word lines of a first vertical sub-block and second word lines of a second vertical sub-block, the first vertical sub-block and the second vertical sub-block including memory cells connected in series in NAND strings, each NAND string including memory cells coupled to the first word lines in series with memory cells connected to the second word lines, the control circuit configured to: program or sense memory cells along a selected first word line of the first vertical sub-block while applying a first voltage to one or more second word lines of the second vertical sub-block that are connected to programmed memory cells and applying a second voltage to one or more second word lines of the second vertical sub-block that are connected to unprogrammed memory cells.

The control circuit may be further configured to identify a boundary between second word lines connected to programmed memory cells and second word lines connected to unprogrammed memory cells of the second vertical sub-block. The control circuit may be further configured to identify the boundary by sensing second word lines of the second vertical sub-block in a binary search of the second word lines. The control circuit may be further configured to identify the boundary by sensing second word lines of the second vertical sub-block in a sequential search of the second word lines. The first voltage may be an overdrive voltage that is sufficient to turn on memory cells programmed to all data states and the second voltage may be a bypass voltage that is sufficient to turn on unprogrammed memory cells and is not sufficient to turn memory cells programmed to one or more data states. The control circuit may be further configured to apply a third voltage to unselected first word lines of the first vertical sub-block, the third voltage may be an overdrive voltage that is sufficient to turn on memory cells programmed to all data states, and the third voltage may be greater than the first voltage. The control circuit may be further configured to program the memory cells along the selected first word line of the first vertical sub-block while applying a first voltage of about 6 volts to 8 volts, a second voltage of about 4 volts to 6 volts, and a third voltage of about 8 to 10 volts. The control circuit may be further configured to sense the memory cells along the selected first word line of the first vertical sub-block while applying a first voltage of about 6 volts to 8 volts, a second voltage of about 2 volts to 4 volts, and a third voltage of about 6 volts to 8 volts. The control circuit may be further configured to independently erase the first and second vertical sub-blocks and to allocate logically unrelated data to the first and second vertical sub-blocks such that write-erase cycle counts of the first and second vertical sub-blocks are independent of each other.

An example method includes: in a non-volatile memory array that includes NAND strings extending through two or more vertical sub-blocks, identifying one or more unselected vertical sub-block connected to a selected vertical sub-block; finding a boundary between a programmed portion and an unprogrammed portion of the one or more unselected vertical sub-block; and during programming or sensing of non-volatile memory cells in the selected vertical sub-block, applying a first voltage to word lines of the unselected vertical sub-block that are in the programmed portion and applying a second voltage to word lines of the unselected vertical sub-block that are in the unprogrammed portion.

The first voltage may be higher than the second voltage. The method may further include applying a third voltage to unselected word lines of the selected vertical sub-block while applying a one or more programming pulses to a selected word line of the selected vertical sub-block during programming of the non-volatile memory cells, the third voltage is higher than the first and second voltages. The method may further include applying a third voltage to unselected word lines of the selected vertical sub-block while sensing the non-volatile memory cells, the third voltage is equal to or greater than the first voltage. The method may further include, during the programming or sensing, applying the first voltage to word lines that are connected to programmed non-volatile memory cells and applying the second voltage to word lines that are connected to unprogrammed non-volatile memory cells in one or more additional vertical sub-blocks that share the NAND strings with the selected vertical sub-block. Finding the boundary may include performing a binary search of word lines of the unselected vertical sub-block. Finding the boundary may include performing a sequential search of word lines of the unselected vertical block.

An example non-volatile storage device includes: a plurality of NAND strings of memory cells, each NAND string having a first set of data memory cells, a second set of data memory cells, and a first non-data transistor between the first and second sets of data memory cells; a plurality of word lines connected to the data memory cells, the word lines comprising a first set of data word lines connected to the first set of data memory cells, and a second set of data word lines connected to the second set of data memory cells; and means for applying a read voltage or a programming pulse on a selected word line of the first set of data word lines to read or program memory cells along the selected word line while applying an overdrive voltage to all programmed data word lines in the second set of data word lines and applying a bypass voltage to all unprogrammed data word lines in the second set of data word lines.

The non-volatile storage device may further include means for identifying programmed data word lines and unprogrammed data word lines in the second set of data word lines by searching the second set of data word lines in a serial or binary search pattern. Each NAND string of the plurality of NAND strings may further comprise at least a third set of data memory cells and a second non-data transistor between the second and third sets of data memory cells; the plurality of word lines may further comprise a third set of data word lines connected to the third set of data memory cells. The overdrive voltage may be about 7 volts and the bypass voltage may be in a range of about 3 volts to about 5 volts.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a control circuit configured to connect to first word lines of a first vertical sub-block and second word lines of a second vertical sub-block, the first vertical sub-block and the second vertical sub-block including memory cells connected in series in NAND strings, each NAND string including memory cells coupled to the first word lines in series with memory cells connected to the second word lines, the control circuit configured to:
program or sense memory cells along a selected first word line of the first vertical sub-block while applying a first voltage to one or more second word lines of the second vertical sub-block that are connected to programmed memory cells and applying a second voltage to one or more second word lines of the second vertical sub-block that are connected to unprogrammed memory cells.

2. The apparatus of claim 1, wherein:
the control circuit is further configured to identify a boundary between second word lines connected to programmed memory cells and second word lines connected to unprogrammed memory cells of the second vertical sub-block.

3. The apparatus of claim 2, wherein:
the control circuit is further configured to identify the boundary by sensing second word lines of the second vertical sub-block in a binary search of the second word lines.

4. The apparatus of claim 2, wherein:
the control circuit is further configured to identify the boundary by sensing second word lines of the second vertical sub-block in a sequential search of the second word lines.

5. The apparatus of claim 1, wherein:
the first voltage is an overdrive voltage that is sufficient to turn on memory cells programmed to all data states and the second voltage is a bypass voltage that is sufficient to turn on unprogrammed memory cells and is not sufficient to turn memory cells programmed to one or more data states.

6. The apparatus of claim 5, wherein:
the control circuit is further configured to apply a third voltage to unselected first word lines of the first vertical sub-block, the third voltage is an overdrive voltage that is sufficient to turn on memory cells programmed to all data states, and the third voltage is greater than the first voltage.

7. The apparatus of claim 6, wherein:
the control circuit is further configured to program the memory cells along the selected first word line of the first vertical sub-block while applying a first voltage of about 6 volts to 8 volts, a second voltage of about 4 volts to 6 volts, and a third voltage of about 8 to 10 volts.

8. The apparatus of claim 6 wherein:
the control circuit is further configured to sense the memory cells along the selected first word line of the first vertical sub-block while applying a first voltage of about 6 volts to 8 volts, a second voltage of about 2 volts to 4 volts, and a third voltage of about 6 volts to 8 volts.

9. The apparatus of claim 1 wherein:
the control circuit is further configured to independently erase the first and second vertical sub-blocks and to allocate logically unrelated data to the first and second vertical sub-blocks such that write-erase cycle counts of the first and second vertical sub-blocks are independent of each other.

10. A method comprising:
in a non-volatile memory array that includes NAND strings extending through two or more vertical sub-blocks, identifying one or more unselected vertical sub-block connected to a selected vertical sub-block;
finding a boundary between a programmed portion and an unprogrammed portion of the one or more unselected vertical sub-block; and
during programming or sensing of non-volatile memory cells in the selected vertical sub-block, applying a first voltage to word lines of the unselected vertical sub-block that are in the programmed portion and applying a second voltage to word lines of the unselected vertical sub-block that are in the unprogrammed portion.

11. The method of claim 10, wherein the first voltage is higher than the second voltage.

12. The method of claim 11, further comprising:
applying a third voltage to unselected word lines of the selected vertical sub-block while applying a one or more programming pulses to a selected word line of the selected vertical sub-block during programming of the non-volatile memory cells, the third voltage is higher than the first and second voltages.

13. The method of claim 11, further comprising:
applying a third voltage to unselected word lines of the selected vertical sub-block while sensing the non-volatile memory cells, the third voltage is equal to or greater than the first voltage.

14. The method of claim 10, further comprising:
during the programming or sensing, applying the first voltage to word lines that are connected to programmed non-volatile memory cells and applying the second voltage to word lines that are connected to unprogrammed non-volatile memory cells in one or more additional vertical sub-blocks that share the NAND strings with the selected vertical sub-block.

15. The method of claim 10, wherein finding the boundary includes performing a binary search of word lines of the unselected vertical sub-block.

16. The method of claim 10, wherein finding the boundary includes performing a sequential search of word lines of the unselected vertical block.

17. A non-volatile storage device comprising:
a plurality of NAND strings of memory cells, each NAND string having a first set of data memory cells, a second set of data memory cells, and a first non-data transistor between the first and second sets of data memory cells;
a plurality of word lines connected to the data memory cells, the word lines comprising a first set of data word lines connected to the first set of data memory cells, and a second set of data word lines connected to the second set of data memory cells; and
means for applying a read voltage or a programming pulse on a selected word line of the first set of data word lines to read or program memory cells along the selected word line while applying an overdrive voltage to all programmed data word lines in the second set of data word lines and applying a bypass voltage to all unprogrammed data word lines in the second set of data word lines.

18. The non-volatile storage device of claim 17, further comprising means for identifying programmed data word lines and unprogrammed data word lines in the second set of data word lines by searching the second set of data word lines in a serial or binary search pattern.

19. The non-volatile storage device of claim 17, wherein:
each NAND string of the plurality of NAND strings further comprises at least a third set of data memory cells and a second non-data transistor between the second and third sets of data memory cells; and
the plurality of word lines further comprises a third set of data word lines connected to the third set of data memory cells.

20. The non-volatile storage device of claim 17, wherein: the overdrive voltage is about 7 volts and the bypass voltage is in a range of about 3 volts to about 5 volts.

* * * * *